United States Patent
Otsuka et al.

(10) Patent No.: US 11,798,821 B2
(45) Date of Patent: Oct. 24, 2023

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventors: Yukinobu Otsuka, Koshi (JP); Shinsuke Takaki, Koshi (JP); Yasuhiro Kuga, Koshi (JP); Koji Ushimaru, Koshi (JP); Ryohei Fujise, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 295 days.

(21) Appl. No.: 17/072,457

(22) Filed: Oct. 16, 2020

(65) Prior Publication Data

US 2021/0118707 A1 Apr. 22, 2021

(30) Foreign Application Priority Data

Oct. 17, 2019 (JP) .................................. 2019-190413
Aug. 3, 2020 (JP) .................................. 2020-131948

(51) Int. Cl.
*H01L 21/67* (2006.01)
*H01L 21/683* (2006.01)
(Continued)

(52) U.S. Cl.
CPC .... *H01L 21/67109* (2013.01); *F27B 17/0025* (2013.01); *F27B 17/0083* (2013.01);
(Continued)

(58) Field of Classification Search
CPC . F27B 3/02; F27D 3/0084; F27D 7/04; H01L 21/67103; H01L 21/67109;
(Continued)

(56) References Cited

U.S. PATENT DOCUMENTS 7,980,003 B2 * 7/2011 Aoki ................. H01L 21/67248
438/584
8,782,918 B2 * 7/2014 Aoki ................. H01L 21/67109
134/10
(Continued)

FOREIGN PATENT DOCUMENTS

JP 2016-115919 A 6/2016

*Primary Examiner* — Gregory A Wilson
(74) *Attorney, Agent, or Firm* — Nath, Goldberg & Meyer; Jerald L. Meyer; Tanya E. Harkins

(57) ABSTRACT

A substrate processing apparatus includes: a heat processing unit configured to perform a heat process on a substrate having a film formed on the substrate; and a control unit configured to control the heat processing unit, wherein the heat processing unit comprises: a heater configured to support and heat the substrate; a chamber configured to cover the substrate supported on the heater; a gas ejector having a head in which ejection holes are formed, and configured to eject a gas from the ejection holes toward a surface of the substrate; an outer peripheral exhauster configured to evacuate a processing space inside the chamber from an outer peripheral region located further outward than a peripheral edge of the substrate supported on the heater; and a central exhauster configured to evacuate the processing space from a central region located further inward than the peripheral edge of the substrate supported on the heater.

17 Claims, 21 Drawing Sheets

(51) Int. Cl.
| | |
|---|---|
| *H01L 21/687* | (2006.01) |
| *F27B 17/00* | (2006.01) |
| *G03F 7/16* | (2006.01) |
| *F27D 3/00* | (2006.01) |
| *H05B 3/22* | (2006.01) |
| *H05B 1/02* | (2006.01) |
| *F27D 5/00* | (2006.01) |

(52) U.S. Cl.
CPC ......... *F27D 3/0084* (2013.01); *F27D 5/0037* (2013.01); *G03F 7/168* (2013.01); *H01L 21/6838* (2013.01); *H01L 21/68742* (2013.01); *H05B 1/0233* (2013.01); *H05B 3/22* (2013.01)

(58) Field of Classification Search
CPC ........... H01L 21/6719; H01L 21/02115; H01L 21/02282; H01L 21/02
See application file for complete search history.

(56) References Cited

U.S. PATENT DOCUMENTS

| | | | |
|---|---|---|---|
| 10,217,652 B2* | 2/2019 | Mizuta | ...................... F27B 3/02 |
| 2021/0118707 A1* | 4/2021 | Otsuka | ................ F27B 17/0083 |

* cited by examiner

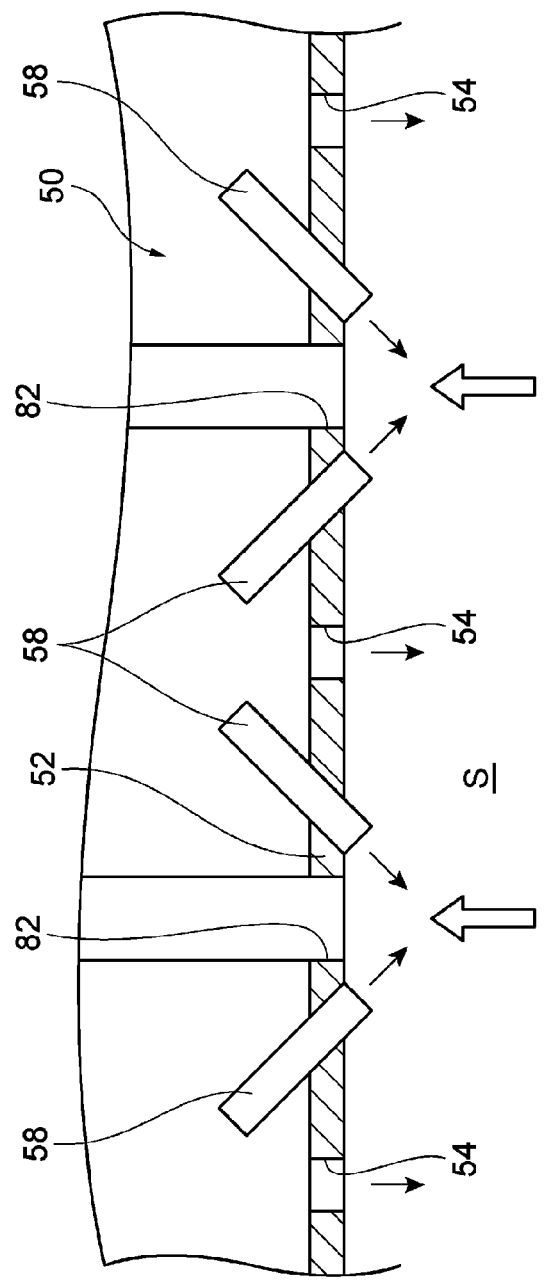

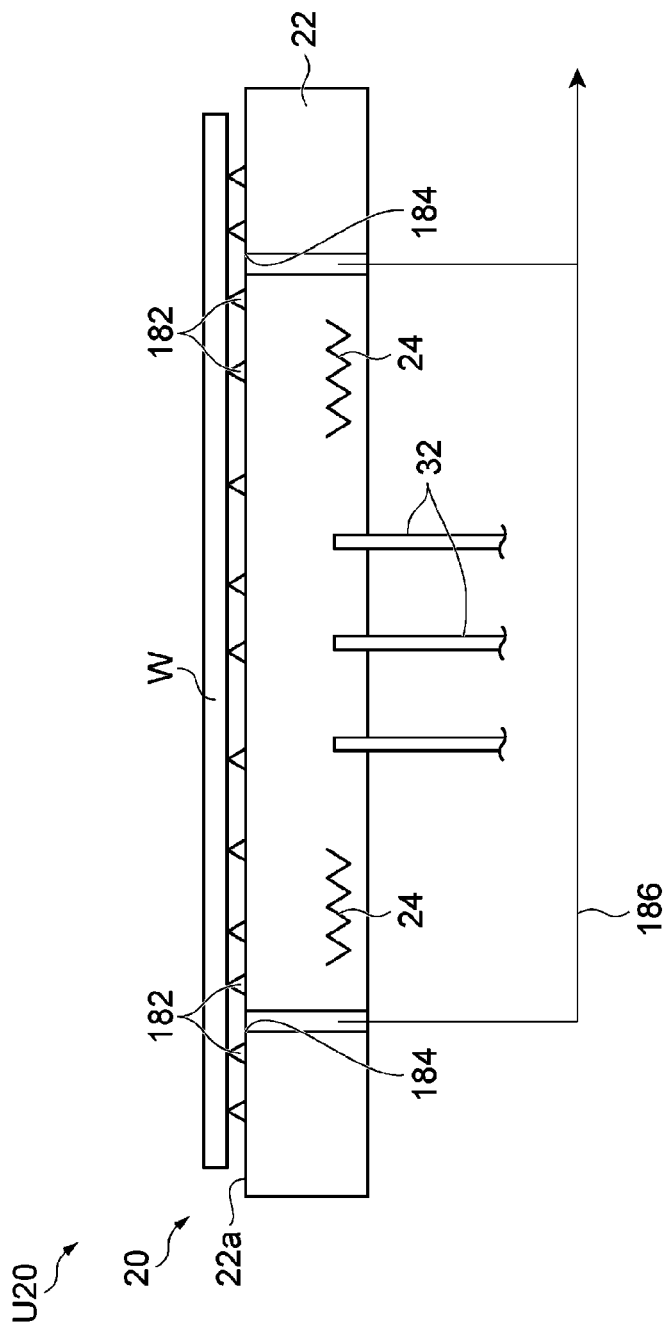

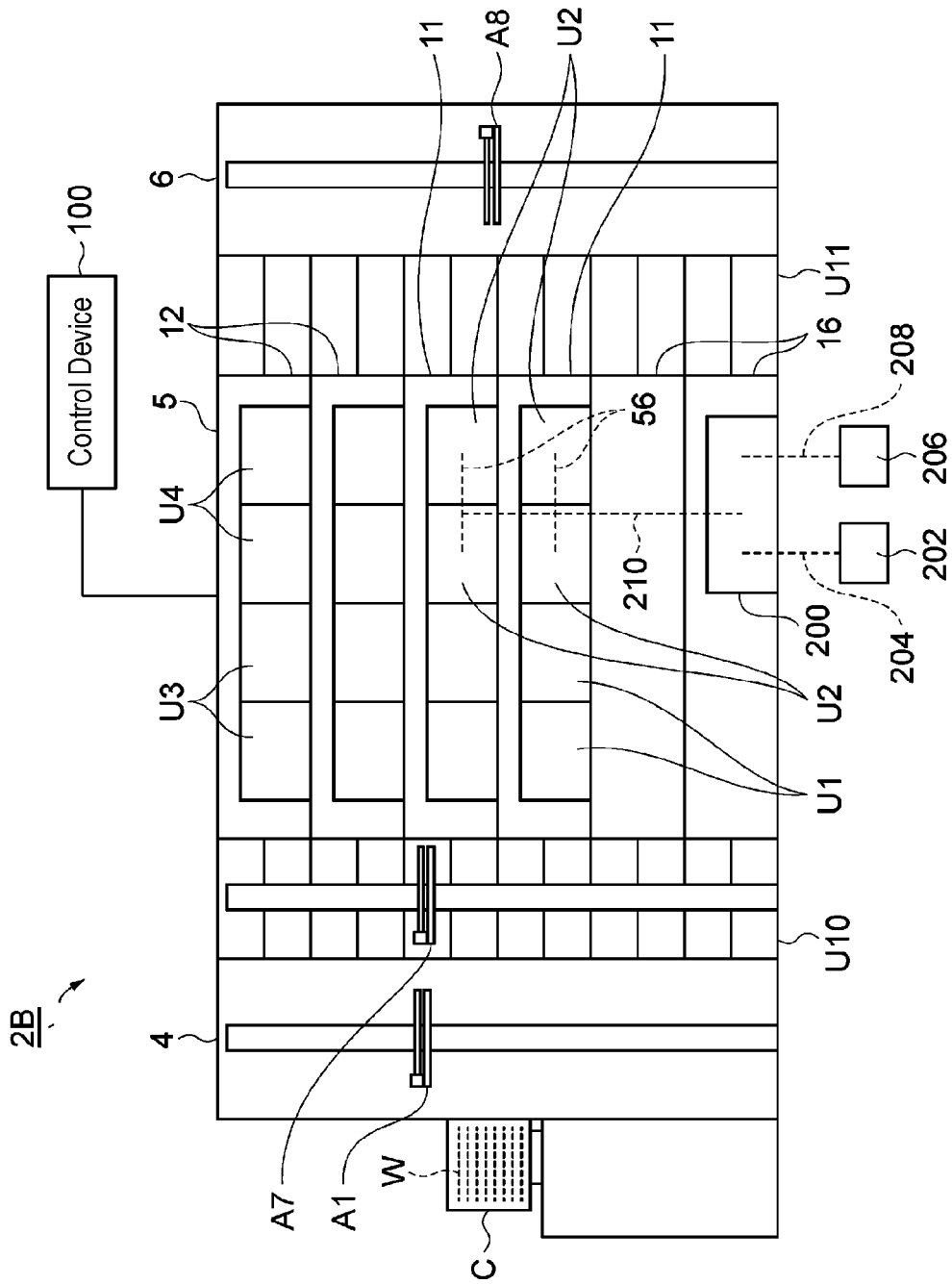

SUBSTRATE PROCESSING APPARATUS, SUBSTRATE PROCESSING METHOD, AND STORAGE MEDIUM

CROSS-REFERENCE TO RELATED APPLICATIONS

This application is based upon and claims the benefit of priority from Japanese Patent Application No. 2019-190413, filed on Oct. 17, 2019, and Japanese Patent Application No. 2020-131948, filed on Aug. 3, 2020, the entire contents of which are incorporated herein by reference.

TECHNICAL FIELD

Embodiments disclosed herein relate to a substrate processing apparatus, a substrate processing method, and a storage medium.

BACKGROUND

Patent Document 1 discloses a heat processing apparatus that heats a coating film formed on a substrate. The heat processing apparatus includes a stage provided in a processing container and configured to place a substrate thereon, a heater configured to heat the substrate placed on the stage, and an outer peripheral exhaust port and a central exhaust port configured to evacuate the interior of the processing container.

PRIOR ART DOCUMENT

Patent Document

Patent Document 1: Japanese laid-open publication No. 2016-115919

SUMMARY

An aspect of the present disclosure provides a substrate processing apparatus including: a heat processing unit configured to perform a heat process on a substrate having a film formed on the substrate; and a control unit configured to control the heat processing unit. The heat processing unit includes: a heater configured to support and heat the substrate; a chamber configured to cover the substrate supported on the heater; a gas ejector having a head in which a plurality of ejection holes scattered along a surface facing the substrate supported on the heater is formed, and configured to eject a gas from the plurality of ejection holes toward a surface of the substrate; an outer peripheral exhauster configured to evacuate a processing space inside the chamber from an outer peripheral region located further outward than a peripheral edge of the substrate supported on the heater; and a central exhauster configured to evacuate the processing space from a central region located further inward than the peripheral edge of the substrate supported on the heater.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 11 is a schematic view illustrating another exemplary gas ejector.

FIG. 16 is a side view schematically illustrating details of an exemplary heater.

FIG. 19 is a schematic view illustrating an exemplary coating and development apparatus included in a substrate processing system according to a third embodiment.

DETAILED DESCRIPTION

Figure 1:
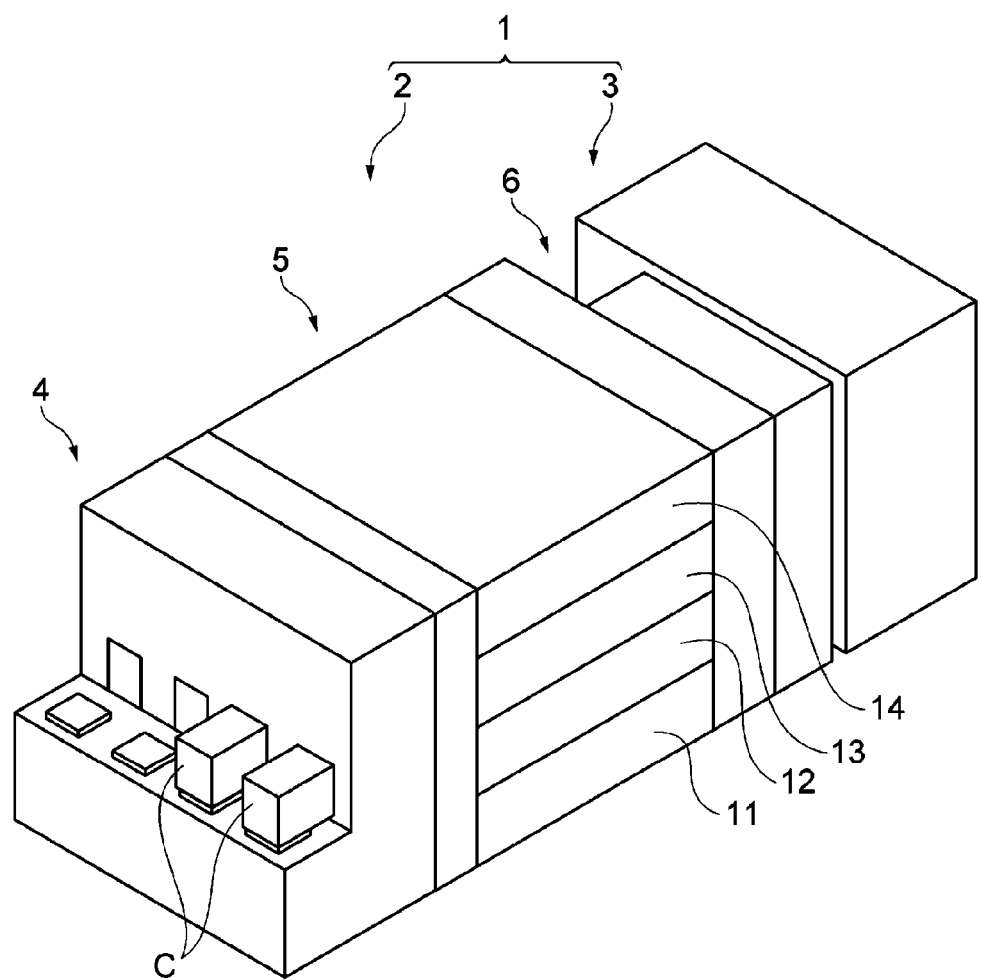
FIG. 1 is a schematic cross-sectional view illustrating an exemplary substrate processing system according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, various exemplary embodiments will be described.

A substrate processing apparatus according to an exemplary embodiment includes: a heat processing unit configured to perform a heat process on a substrate having a film formed on the substrate; and a control unit configured to control the heat processing unit. The heat processing unit includes: a heater configured to support and heat the substrate; a chamber configured to cover the substrate supported on the heater; a gas ejector having a head in which a plurality of ejection holes scattered along a surface facing the substrate supported on the heater is formed, and configured to eject a gas from the plurality of ejection holes to a surface of the substrate; an outer peripheral exhauster configured to evacuate a processing space inside the chamber from an outer peripheral region located further outward than a peripheral edge of the substrate supported on the heater; and a central exhauster configured to evacuate the processing space from a central region located further inward than the peripheral edge of the substrate supported on the heater.

In the heat processing unit of the substrate processing apparatus, the central exhauster is capable of evacuating the central region during the heat process of the substrate, and thus a sublimate from the film is efficiently recovered. In addition, since the gas is ejected onto the surface of the substrate by the gas ejector, an upward gas flow due to the gas exhaustion from the central region is suppressed. Thus, influence of the gas flow on a thickness of the film is uniform in the plane of the substrate. Accordingly, it is possible to improve uniformity in thickness of the film as a heat processing target while efficiently recovering the sublimate.

The heat processing unit may further include an exhaust switcher configured to switch an exhaust state between a first state in which the processing space is evacuated from the outer peripheral exhauster, and a second state in which the processing space is evacuated at least from the central exhauster. The control unit may control the exhaust switcher to switch from the first state to the second state while ejecting the gas from the plurality of ejection holes by the gas ejector. In a latter stage of heating the substrate as a processing target, film formation proceeds, and thus influence of the gas exhaustion on variation in film thickness is small. With the configuration described above, it is possible to perform a central exhaustion in the latter stage of heating the substrate. Therefore, it is possible to improve the uniformity in thickness of the film as a heat processing target while efficiently recovering the sublimate.

The heat treatment unit may further include: a substrate lifter configured to move the substrate up and down; and an opening and closing switcher configured to switch between a closed state in which the processing space is formed by the chamber, and an open state in which the chamber is separated from the heater compared to the closed state. The chamber may include a ceiling plate provided with the head. The control unit may be further configured to: control the substrate lifter to move up the substrate from the heater and bring the substrate closer to the ceiling plate; and control the opening and closing switcher to switch from the closed state to the open state after bringing the substrate closer to the ceiling plate. In this case, the sublimate generated from the film on the substrate in the state of being brought closer to the ceiling plate is more reliably recovered. Therefore, it is possible to suppress contamination of the heat processing unit due to the sublimate generated from the film.

The outer peripheral exhauster may have an outer peripheral exhaust hole through which the processing space is evacuated. The control unit may be further configured to control the substrate lifter to move up the substrate to a position higher than the outer peripheral exhaust hole when the substrate is brought closer to the ceiling plate. In this case, when the substrate is brought closer to the ceiling plate, the gas flow generated on the surface of the substrate due to the gas exhaustion by the outer peripheral exhaust hole is weakened. Therefore, the possibility that the sublimate will flow out of the substrate is reduced, and it is possible to more efficiently recover the sublimate.

The chamber may cover the substrate on the heater in a state in which a communication portion connecting the processing space and an external space of the chamber is formed in the outer peripheral region. The outer peripheral exhauster may include an outer peripheral exhaust hole that is open to the communication portion, and may evacuate the processing space through the outer peripheral exhaust hole and the communication portion. In this case, it is possible to prevent the sublimate from leaking to the external space of the chamber via the communication portion.

The chamber may include a holder configured to hold the heater, and a lid arranged in a state in which a gap is provided between the holder and the lid so as to cover the substrate on the heater from above. The gap between the holder and the lid may function as the communication portion. In this case, since the chamber can be opened and closed without contact between members, it is possible to suppress generation of particles due to the opening and closing of the chamber.

The heat processing unit may sequentially perform the heat process on a plurality of substrates including the above-mentioned substrate. The control unit may be configured to cause the gas to be continuously ejected from the plurality of ejection holes during a period in which a substrate as a processing target is replaced. In this case, change in ambient temperature due to the ejection of the gas from the gas ejector is maintained substantially constant. Therefore, it is possible to stabilize results of the heat process between substrates.

The central exhauster may include a central exhaust hole provided in the head so as to be open to the processing space. The gas ejector may further include a nozzle configured to eject the gas toward the lower side of the central exhaust hole. In this case, by ejecting the gas from the nozzle to the lower side of the central exhaust hole, it is possible to suppress an amount of protrusion of the film thickness in the vicinity of the central exhaust hole. Therefore, it becomes possible to further improve the uniformity in film thickness in the plane of the substrate.

The substrate processing apparatus may further include a gas supply unit configured to mix a first gas containing one component and a second gas containing another component so as to generate an adjusted gas that is adjusted such that a concentration of the one component becomes a predetermined value, and configured to supply the adjusted gas to the gas ejector. The gas ejector may eject, as the gas ejected from the plurality of ejection holes, the adjusted gas toward the surface of the substrate. The gas supply unit may be arranged in a separate space partitioned from a space in which the heat processing unit is arranged. In this case, it is possible to reduce the influence of the heat generated in the heat process on a member for generating the adjusted gas.

The control unit may be further configured to cause the gas ejector to eject the adjusted gas at least in the first half of a period during which the heater heats the substrate. Since the film formation proceeds during the first half of the period during which the substrate is heated, it is possible to more reliably adjust the quality of the film by using the adjusted gas.

The heater may include: a hot plate configured to generate heat for heating the substrate; a plurality of gap pins provided on a main surface of the hot plate to support the substrate such that a gap is formed between the main surface and the substrate; and a suction hole formed in the main surface to suction the substrate placed on the plurality of gap pins. The plurality of gap pins may include a first group of gap pins arranged in a suction region of the main surface in the vicinity of the suction hole, and a second group of gap pins arranged in a non-suction region of the main surface other than the suction region. The number of gap pins of the first group per unit area in the suction region may be greater than the number of gap pins of the second group per unit area in the non-suction region. Since a suction force from the suction hole is large in the suction region, a load applied to one gap pin tends to increase due to a stress generated inside the substrate. In the configuration described above, since the number of gap pins of the first group per unit area is set to be large in the suction region, an increase in the load applied to one gap pin is suppressed.

The substrate processing apparatus may include a plurality of heat processing units including the heat processing unit described above. The heater may include: a hot plate configured to generate heat for heating the substrate; a plurality of gap pins provided on the main surface of the hot plate to support the substrate such that a gap is formed between the main surface and the substrate; and a suction hole formed in the main surface to suction the substrate placed on the plurality of gap pins. The plurality of heat processing units may include a first heat processing unit and a second heat processing unit. A heating temperature of the substrate in the heat process performed by the first heat processing unit may be higher than a heating temperature of the substrate in the heat process performed by the second heat processing unit. The number of the plurality of gap pins included in the heater of the first heat processing unit may be greater than the number of the plurality of gap pins included in the heater of the second heat processing unit. When the heating temperature of the substrate in the heat process is high, the load applied to one gap pin tends to increase due to the stress generated inside the substrate by thermal expansion of the substrate. In the configuration described above, by setting the number of gap pins included in the heater of the first heat processing unit, which performs the heat process at a high heating temperature, to be large, the increase in the load applied to one gap pin is suppressed.

The substrate processing apparatus may include a plurality of heat processing units including the heat processing unit described above. The heater may include: a hot plate configured to generate heat for heating the substrate; a plurality of gap pins provided on the main surface of the hot plate to support the substrate such that a gap is formed between the main surface and the substrate; and a suction hole formed in the main surface to suction the substrate placed on the plurality of gap pins. The plurality of heat processing units may include a first heat processing unit and a second heat processing unit. The suction force applied to the substrate from the suction hole in the first heat heating unit may be larger than the suction force applied to the substrate from the suction hole in the second heat processing unit. The number of the plurality of gap pins included in the heater of the first heat processing unit may be greater than the number of the plurality of gap pins included in the heater of the second heat processing unit. When the suction force from the suction hole is large, the load applied to one gap pin tends to increase due to the stress generated inside the substrate. In the configuration described above, by setting the number of gap pins included in the heater of the first heat processing unit, which performs the heat process in a state in which the suction force is high, to be large, it is possible to suppress the increase in the load applied to one gap pin.

A substrate processing method according to an exemplary embodiment may include performing a heat process on a substrate having a film formed on the substrate. The performing the heat process on the substrate may include: causing the substrate to be supported on and heated by a heater in a state in which the substrate is covered by a chamber; evacuating a processing space inside the chamber from an outer peripheral region located further outward than a peripheral edge of the substrate supported on the heater; evacuating the processing space from a central region located further inward than the peripheral edge of the substrate supported on the heater; and ejecting a gas toward a surface of the substrate from a plurality of ejection holes scattered along a surface facing the substrate supported on the heater. In this case, like the substrate processing apparatus described above, it is possible to improve the uniformity in thickness of the film as a heat processing target while efficiently recovering the sublimate.

The performing the heat process on the substrate may further include switching from a first state in which the processing space is evacuated from the outer peripheral region, to a second state in which the processing space is evacuated at least from the central region, while ejecting the gas from the plurality of ejection holes toward the surface of the substrate. In this case, like the substrate processing apparatus described above, it is possible to further improve the uniformity in thickness of the film as a heat processing target while efficiently recovering the sublimate.

The performing the heat process on the substrate may further include: bringing the substrate closer to a ceiling plate of the chamber by moving up the substrate from the heater; and switching from a closed state in which the processing space is formed by the chamber, to an open state in which the chamber is separated from the heater compared to the closed state, after bringing the substrate closer to the ceiling plate. In this case, like the substrate processing apparatus described above, it is possible to suppress the contamination of the heat processing unit due to the sublimate generated from the film.

The evacuating the processing space from the outer peripheral region may include evacuating the processing space through an outer peripheral exhaust hole. The bringing the substrate closer to the ceiling plate may include moving up the substrate to a position higher than the outer peripheral exhaust hole. In this case, like the substrate processing apparatus described above, it is possible to more efficiently recover the sublimate.

The substrate processing method may further include sequentially performing the heat process on a plurality of substrates including the substrate described above. Sequentially performing the heat process on the plurality of substrates may include continuously ejecting the gas from the plurality of ejection holes during a period in which a substrate as a processing target is replaced. In this case, like the substrate processing apparatus described above, it is possible to stabilize the results of heat process between the substrates.

The evacuating the processing space from the central region may further include discharging the gas the in the processing space through a central exhaust hole provided in a head having the plurality of ejection holes formed in the head; and ejecting the gas from the nozzle toward a lower side of the central exhaust hole. In this case, like the substrate processing apparatus described above, it is possible to further improve the uniformity in thickness of the film in the plane of the substrate.

A storage medium according to an exemplary embodiment is a non-transitory computer-readable storage medium that stores a program for causing an apparatus to execute the substrate processing method described above.

Hereinafter, various embodiments will be described in detail with reference to the drawings. In the description, the same elements or elements having the same function will be denoted by the same reference numerals, and a redundant description will be omitted.

First Embodiment

First, a substrate processing system according to a first embodiment will be described with reference to FIGS. 1 to 12B. The substrate processing system 1 illustrated in FIG. 1 is a system for forming a photosensitive film on a substrate, exposing the photosensitive film, and developing the photosensitive film. The substrate as a processing target is, for example, a semiconductor wafer W. The photosensitive film is, for example, a resist film. The substrate processing system 1 includes a coating and development apparatus 2 and an exposure apparatus 3. The exposure apparatus 3 is an apparatus for exposing the resist film (photosensitive film) formed on the wafer (substrate) W. Specifically, the exposure apparatus 3 irradiates an exposure target portion of the resist film with an energy beam using a method such as a liquid immersion exposure method. The coating and development apparatus 2 performs a process of applying a resist (a chemical liquid) to a surface of the wafer W having an underlayer film thereon to form a resist film before an exposure process performed by the exposure apparatus 3, and a development process of the resist film after the exposure process.

[Substrate Processing Apparatus]

Figure 2:
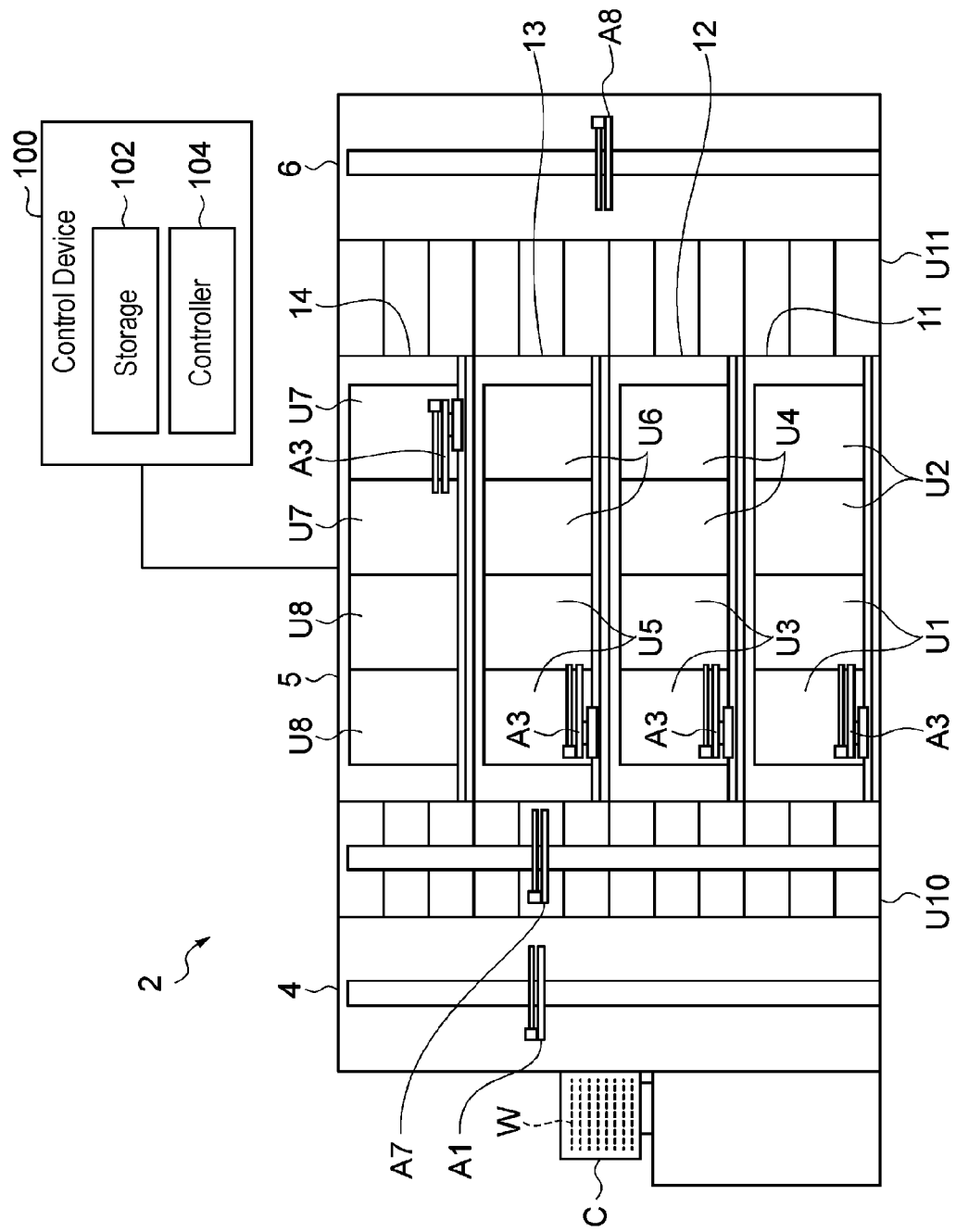
FIG. 2 is a schematic view illustrating an exemplary coating and development apparatus.

Hereinafter, the configuration of the coating and development apparatus 2 will be described as an example of a substrate processing apparatus. As illustrated in FIGS. 1 and 2, the coating and development apparatus 2 includes a carrier block 4, a processing block 5, an interface block 6, and a control device 100 (control unit).

The carrier block 4 loads a wafer W to the interior of the coating and development apparatus 2 and unloads a wafer W from the interior of the coating and development apparatus 2. For example, the carrier block 4 is capable of supporting a plurality of carriers C for wafers W, and incorporates a transfer device A1 including a delivery arm. Each carrier C accommodates, for example, a plurality of circular wafers W. The transfer device A1 takes the wafers W out of the carriers C and delivers the wafers W to the processing block 5. In addition, and the transfer device A1 receives wafers W from the processing block 5 and returns the wafers W into the carriers C. The processing block 5 includes a plurality of processing modules 11, 12, 13, and 14.

The processing module 11 includes a coating unit U1, a heat processing unit U2, and a transfer device A3 configured to transfer wafers W to the units U1 and U2. The processing module 11 forms an underlayer film on the surface of the wafer W by using the coating unit U1 and the heat processing unit U2. The coating unit U1 applies a processing liquid for forming the underlayer film to the wafer W. The heat processing unit U2 performs various kinds of heat processes associated with the formation of the underlayer film. That is, the heat processing unit U2 performs heat processes on the wafer W having a film of the processing liquid formed thereon. Thus, the underlayer film is formed on the wafer W. A specific example of the underlayer film may include, for example, a hard mask such as a spin-on-carbon (SOC) film. When the wafer W having a film formed thereon is heated in the heat processes, a sublimate (an unnecessary substance) is generated from the film. Thus, the heat processing unit U2 is provided with an exhauster for discharging the sublimate.

The processing module 12 includes a coating unit U3, a heat processing unit U4, and a transfer device A3 configured to transfer wafers W to the units U3 and U4. The processing module 12 forms a resist film on the underlayer film by using the coating unit U3 and the heat processing unit U4. The coating unit U3 applies a processing liquid for forming a resist film on the underlayer film. The heat processing unit U4 performs various kinds of heat processes associated with the formation of the film.

The processing module 13 includes a coating unit U5, a heat processing unit U6, and a transfer device A3 configured to transfer wafers W to the units U5 and U6. The processing module 13 forms an upper-layer film on the resist film by using the coating unit U5 and the heat processing unit U6. The coating unit U5 applies a processing liquid for forming the upper-layer film on the resist film. The heat processing unit U6 performs various kinds of heat processes associated with the formation of the upper-layer film.

The processing module 14 includes a development unit U7, a heat processing unit U8, and a transfer device A3 configured to transfer wafers W to the units U7 and U8. The processing module 14 performs a development process on the exposed resist film and heat processes associated with the development process by using the development unit U7 and the heat processing unit U8. The development unit U7 performs the development process on the resist film by applying a developer on the exposed surface of the wafer W and then rinsing the developer by using a rinsing liquid. The heat processing unit U8 performs various kinds of heat processes associated with the development process. Specific examples of the heat processes may include a heating process before the development process (post-exposure bake (PEB)) and a heating process after the development process (post-bake (PB)).

A shelf unit U10 is provided on the side of the carrier block 4 in the processing block 5. The shelf unit U10 is partitioned into a plurality of cells aligned in a vertical direction. A transfer device A7 including a lifting arm is provided in the vicinity of the shelf unit U10. The transfer device A7 moves wafers W up and down between cells of the shelf unit U10.

A shelf unit U11 is provided on the side of the interface block 6 in the processing block 5. The shelf unit U11 is partitioned into a plurality of cells aligned in the vertical direction.

The interface block 6 delivers wafers W to and from the exposure apparatus 3. For example, the interface block 6 incorporates a transfer device A8 including a delivery arm, and is connected to the exposure apparatus 3. The transfer device A8 delivers wafers W placed on the shelf unit U11 to the exposure apparatus 3. The transfer device A8 receives wafers W from the exposure apparatus 3 and returns the wafers W to the shelf unit U11.

The specific configuration of the substrate processing apparatus is not limited to the configuration of the coating and development apparatus 2 described above as an example. The substrate processing apparatus may be any apparatus, as long as it includes a heat processing unit for performing heat processes on a film such as an underlayer film and a control device capable of controlling the heat processing unit.

(Heat Processing Unit)

Figure 3:
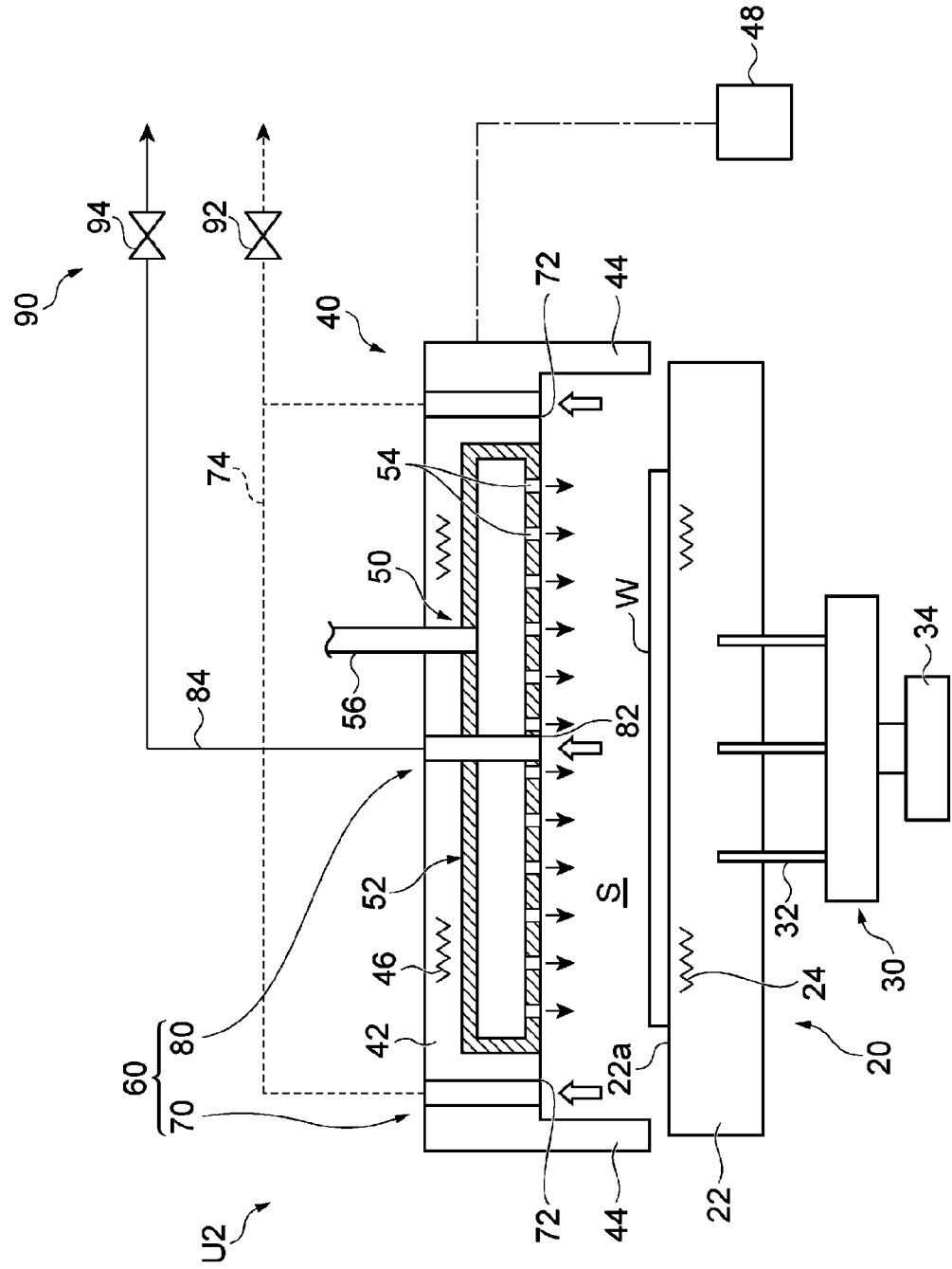
FIG. 3 is a schematic view illustrating an exemplary heat treatment unit.

Subsequently, an example of the heat processing unit U2 of the processing module 11 will be described in detail with reference to FIGS. 3 and 4. As illustrated in FIG. 3, the heat processing unit U2 includes a heater 20, a substrate lifter 30, a chamber 40, and an exhauster 60. In FIG. 3, hatching indicating a cross section is omitted, except for some elements.

The heater 20 supports and heats a wafer W. The heater 20 includes, for example, a hot plate 22 and a hot plate heater 24. The hot plate 22 supports the wafer W as a heating target and delivers heat to the wafer W supported thereon. The hot plate heater 24 increases a temperature of the hot plate 22. As an example, the temperature of the hot plate 22 is maintained at about 300 degrees C. to 500 degrees C. during the heat process. The hot plate heater 24 is provided, for example, inside the hot plate 22. The hot plate 22 is formed in, for example, a substantially disc-like shape. The diameter of the hot plate 22 may be larger than the diameter of the wafer W. The hot plate 22 has a mounting surface 22a, and supports the wafer W in a state in which the wafer W is placed at a predetermined location on the mounting surface 22a. The hot plate 22 may be formed of a metal having a high thermal conductivity, such as aluminum, silver, or copper.

The substrate lifter 30 moves the wafer W up and down on the hot plate 22. The substrate lifter 30 moves the wafer W up and down between, for example, a processing position where the wafer W is placed on the mounting surface 22a of the hot plate 22 and a delivery position where the wafer W is delivered between the substrate lifter 30 and a loading apparatus (unloading apparatus) above the hot plate 22. The substrate lifter 30 has a plurality of (e.g., three) support pins 32 and a lifting driver 34.

The support pins 32 support the wafer W from below. The support pins 32 penetrate, for example, the hot plate 22 and are configured to extend in the vertical direction. The plurality of support pins 32 may be arranged at equal intervals in a circumferential direction around the center of the hot plate 22. The lifting driver 34 moves the support pins 32 up and down by using an electric motor or a lifting cylinder as a power source. The lifting driver 34 raises the support pins 32 such that the upper ends of the support pins 32 protrude above the mounting surface 22a, thereby raising the wafer W to the delivery position. In addition, the lifting driver 34 lowers the support pins 32 such that the upper ends of the support pins 32 are located below the mounting surface 22a, thereby lowing the wafer W to the processing position (placing the wafer W on the mounting surface 22a). The lifting driver 34 moves the support pins 32 up and down in response to an operation instruction from the control device 100. Thus, the wafer W is moved up and down between the processing position and the delivery position.

The chamber 40 covers the wafer W supported by the heater 20. When the chamber 40 covers the wafer W on the hot plate 22, a processing space S where the heat process is performed is formed on the hot plate 22. The processing space S is a space that is closed enough to sufficiently heat the film on the wafer W. The chamber 40 has, for example, a ceiling plate 42, a side wall 44, and a chamber heater 46.

The ceiling plate 42 is formed in a disc shape having a diameter similar to that of the hot plate 22. The ceiling plate 42 is arranged to face the mounting surface 22a of the hot plate 22 in the vertical direction. That is, the ceiling plate 42 covers the mounting surface 22a from above. The side wall 44 is formed to extend downward from the outer edge of the ceiling plate 42. The side wall 44 surrounds the mounting surface 22a. In the example illustrated in FIG. 3, the processing space S is constituted by the bottom surface of the ceiling plate 42, the inner surface of the side wall 44, and the mounting surface 22a. The chamber heater 46 is provided in the ceiling plate 42 and increases a temperature of the ceiling plate 42 (the chamber 40). Thus, adhesion of a sublimate, which is generated by heating the film as a processing target, to the chamber 40 is suppressed.

The chamber 40 is provided within a housing of the heat processing unit U2 so as to be movable in the vertical direction. The heat processing unit U2 has, for example, a chamber driver 48 (opening and closing switcher) that drives the chamber 40. The chamber driver 48 moves the chamber 40 in the vertical direction by using, for example, an electric motor as a power source. When the chamber 40 is moved down by the chamber driver 48, the processing space S is formed by the chamber 40. Hereinafter, the state in which the processing space S is formed by the chamber 40 will be referred to as a "closed state." In the closed state, the lower end of the chamber 40 (the side wall 44) is close to the hot plate 22. For example, in the closed state, the lower end of the side wall 44 (the lower end and the vicinity of the side wall 44) may be in contact with the hot plate 22, or a gap may be formed between the lower end of the side wall 44 and the hot plate 22. In this way, in the closed state, a sealed processing space S may be formed, or a processing space S with a gap in a part thereof may be formed. FIG. 3 illustrates the case where a gap is formed between the side wall 44 and the hot plate 22.

When the chamber 40 is moved up by the chamber driver 48, the chamber 40 is separated from the heater 20 (the hot plate 22), compared with the closed state. Hereinafter, the state in which the chamber 40 is separated from the heater 20 compared with the closed state will be referred to as an "open state." In the open state, the processing space S is not formed above the hot plate 22, and the space above the hot plate 22 is open to an external space of the chamber 40. That is, in the open state, the chamber 40 is separated from the hot plate 22 to the extent that the wafer W cannot be sufficiently heated. The chamber driver 48 moves the chamber 40 up and down in response to an operation instruction from the control device 100. Thus, the closed state and the open state are switched each other.

The chamber 40 includes a gas ejector 50. In the processing space S in the chamber 40, the gas ejector 50 ejects a gas from above toward the wafer W on the hot plate 22. The gas ejector 50 ejects the gas toward, for example, substantially the entire surface of the wafer W. A type of the gas ejected by the gas ejector 50 is not limited, but, for example, air, a gas with an adjusted content of water, or an inert gas (nitrogen gas) may be used. A gas source is connected to the gas ejector 50 via a supply path 56. The gas ejector 50 may have a head 52 provided on the ceiling plate 42. In the head 52, a buffer space is provided at a lower portion of the ceiling plate 42, and a plurality of ejection holes 54 is formed in the bottom surface of the ceiling plate 42, which faces the wafer W on the hot plate 22, so as to penetrate the ceiling plate 42 between the buffer space and the processing space S. The buffer space is a space that connects the plurality of ejection holes 54 and the supply path 56.

Figure 4:
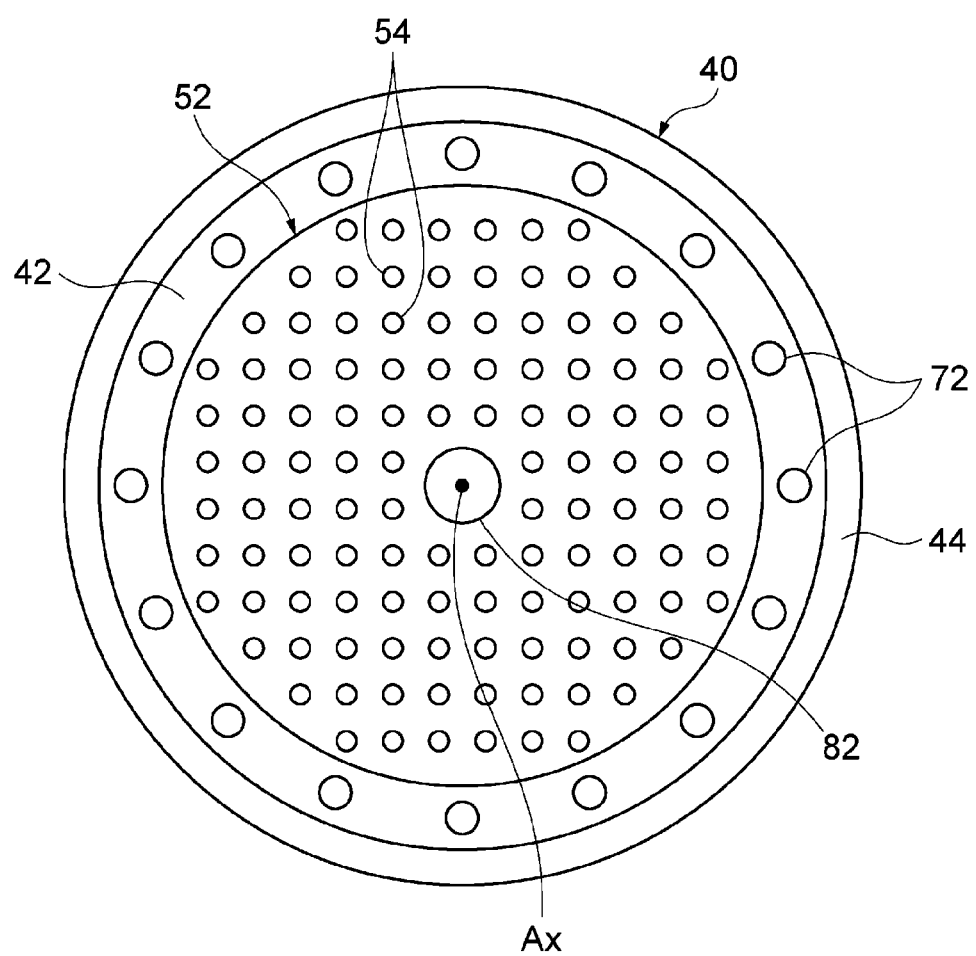
FIG. 4 is a schematic view illustrating an exemplary gas ejector.
Figure 5:
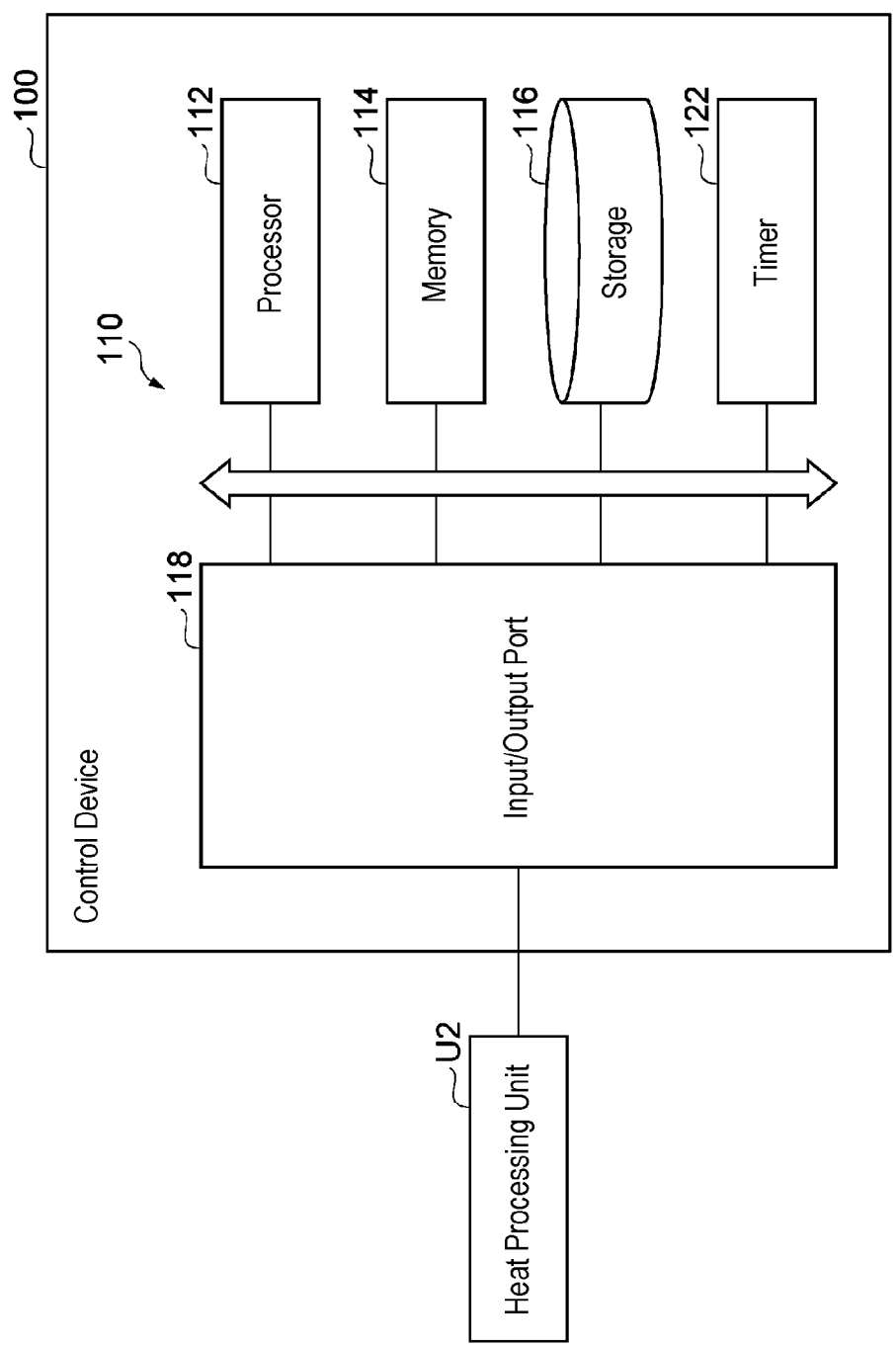
FIG. 5 is a block diagram illustrating an exemplary hardware configuration of a control device.

FIG. 4 is a schematic bottom view of the chamber 40 illustrated in FIG. 3. As illustrated in FIG. 4, the ejection holes 54 are scattered along the bottom surface of the ceiling plate 42. The ejection holes 54 are scattered at a substantially uniform density, for example, in a portion of the bottom surface of the ceiling plate 42 facing the wafer W on the hot plate 22 ("facing portion"). The ejection holes 54 may also be provided outside the facing portion (outside the peripheral edge of the wafer W) when viewed from above. The ejection holes 54 are arranged in a scattered manner in the facing portion. The ejection holes 54 may be scattered such that when a gas such as air is ejected from the gas ejector 50, an ejection amount per unit time is substantially uniform over the entire surface of the wafer W.

Opening areas of the plurality of ejection holes 54 may be substantially the same with one another. When the opening areas of the plurality of ejection holes 54 are substantially the same with one another, the ejection holes 54 may be scattered such that a ratio occupied by the opening areas of the ejection holes 54 per unit area of the facing portion is uniform. The shape of the ejection holes 54 may be a circle or an ellipse when viewed in the vertical direction. The ejection holes 54 may be scattered such that intervals between adjacent ejection holes 54 are substantially the same with one another. As an example, as illustrated in FIG. 4, when the ejection holes 54 are two-dimensionally arranged in the transverse direction and the longitudinal direction, the intervals between the ejection holes 54 adjacent to each other in the transverse direction may be uniform, or the intervals between ejection holes 54 adjacent to each other in the longitudinal direction may be uniform. The intervals between the ejection holes 54 adjacent to each other in the transverse direction may be substantially the same with the intervals between the ejection holes 54 adjacent to each other in the longitudinal direction.

Returning to FIG. 3, the exhauster 60 exhausts the gas in the chamber 40 (in the processing space S) to the outside of the chamber 40. The exhauster 60 includes an outer peripheral exhauster 70, a central exhauster 80, and an exhaust switcher 90.

The outer peripheral exhauster 70 exhausts the gas in the processing space S from an outer peripheral region disposed outward than the peripheral edge of the wafer W supported by the heater 20. The outer peripheral exhauster 70 evacuates the interior of the chamber 40 from the outer periphery of the processing space S via, for example, a plurality of exhaust holes 72 (a plurality of outer peripheral exhaust holes) provided outward than the gas ejector 50. The exhaust holes 72 are provided outward than the head 52 of the gas ejector 50, as illustrated in FIG. 4.

The exhaust holes 72 are provided in the ceiling plate 42 of the chamber 40, and opened at the outer peripheral portion of the bottom surface of the ceiling plate 42 (that is, the outer peripheral portion of the top surface of the processing space S). The exhaust holes 72 may be annularly arranged outward than the head 52. The exhaust holes 72 may be located outward than the peripheral edge of the wafer W on the hot plate 22 when viewed from above. In other words, the exhaust holes 72 may not overlap the wafer W on the hot plate 22 when viewed from above. A shape of the exhaust holes 72 in the ceiling plate 42 is not particularly limited. The exhaust holes 72 are connected to an exhaust pump via an exhaust duct 74. Due to the suction of the exhaust pump, the gas in the processing space S is discharged to the outside of the chamber 40 through the exhaust holes 72.

The central exhauster 80 exhausts the gas in the processing space S from a central region disposed inward than the peripheral edge of the wafer W supported on the heater 20. When viewed from above, the outer edge of the central region is defined by, for example, a circle having a radius about half the radius of the wafer W. However, the central region is not limited to those described above, and for example, the central exhauster 80 may be configured to exhaust the gas from a region disposed outward than about the half of the radius of the wafer W. The central exhauster 80 may have a single exhaust hole 82 (central exhaust hole) provided in the head 52 of the gas ejector 50, and a central axis Ax of the central exhauster 80 may be located in the exhaust hole 82. As illustrated in FIG. 4, the center of the exhaust hole 82 may substantially coincide with the central axis Ax. Alternatively, the center of the exhaust hole 82 may be eccentric with respect to the central axis Ax in the central region.

The exhaust hole 82 is provided in the gas ejector 50 so as to be opened toward the processing space S. Specifically, the exhaust hole 82 is provided in the ceiling plate 42 including the head 52 of the gas ejector 50, and is opened in a central portion of the bottom surface of the ceiling plate 42. A shape of the exhaust hole 82 in the ceiling plate 42 including the head 52 is not particularly limited. As an example, the shape of the exhaust hole 82 may be a circle or an ellipse when viewed in the vertical direction. A size (diameter) of the exhaust hole 82 may be larger than a size (diameter) of the ejection holes 54, or may be larger than that of the exhaust holes 72. The exhaust hole 82 is connected to an exhaust pump via an exhaust duct 84. Due to the suction of the exhaust pump, the gas in the processing space S is discharged to the outside of the chamber 40 through the exhaust hole 82.

The exhaust switcher 90 switches an exhaust state from the processing space S. Specifically, the exhaust switcher 90 performs switching between a state in which the processing space S is evacuated from the outer peripheral exhauster 70 (hereinafter, referred to as a "first state") and a state, in which the processing space S is evacuated at least from the central exhauster 80 (hereinafter, referred to as a "second state"). Hereinbelow, as an example of the second state, a case where the processing space S is evacuated not only from the central exhauster 80 but also from the outer peripheral exhauster 70 is illustrated. The exhaust switcher 90 has, for example, a valve 92 and a valve 94.

The valve 92 switches the exhaust state of the outer peripheral exhauster 70. Specifically, the valve 92 is provided in the exhaust duct 74, and opens and closes the passage between the exhaust holes 72 and the exhaust pump. The valve 94 switches the exhaust state of the central exhauster 80. Specifically, the valve 94 is provided in the exhaust duct 84, and opens and closes the passage between the exhaust hole 82 and the exhaust pump. The exhaust pump may continue exhausting at all times while the coating and development apparatus 2 is in operation, and the exhaust state from the processing space S may be switched by opening and closing the valves 92 and 94 individually. In this case, when the valve 92 is closed, the exhaust from the outer peripheral exhauster 70 is stopped, and when the valve 92 is open, the exhaust from the outer peripheral exhauster 70 is performed. In addition, when the valve 94 is closed, the exhaust from the central exhauster 80 is stopped, and when the valve 94 is open, the exhaust from the central exhauster 80 is performed. The exhaust switcher 90 (valves 92 and 94) operates in response to an operation instruction from the control device 100. Each of the valves 92 and 94 is, for example, a solenoid valve.

Figure 9A:
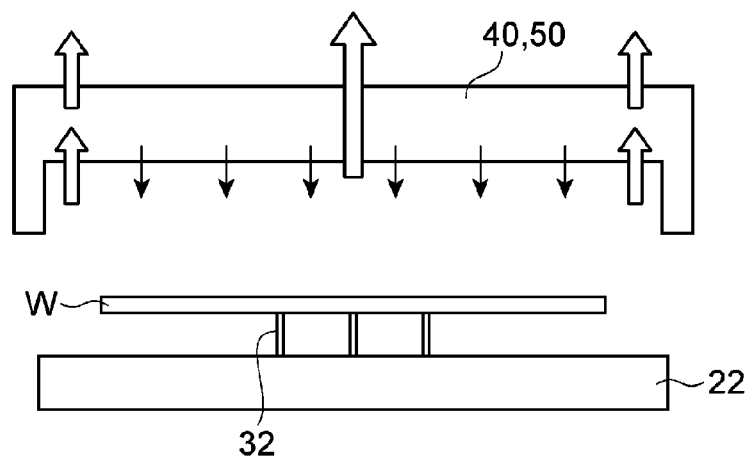
FIGS. 9A to 9C are schematic views illustrating an exemplary operation of respective components and flow of gas in a heat processing procedure.
Figure 9B:
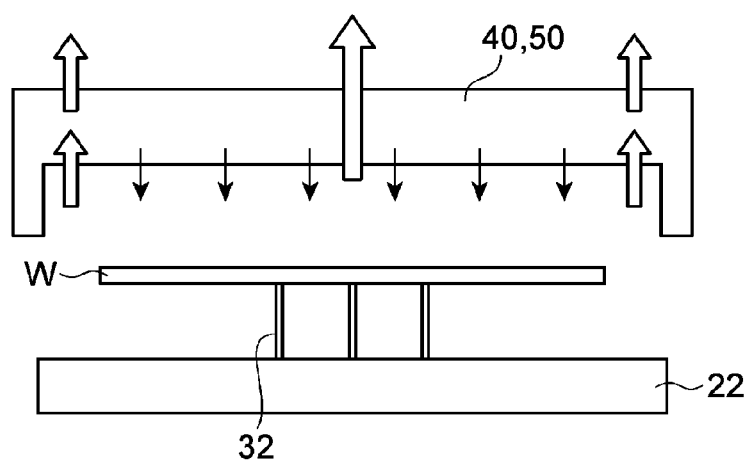
Figure 9C:
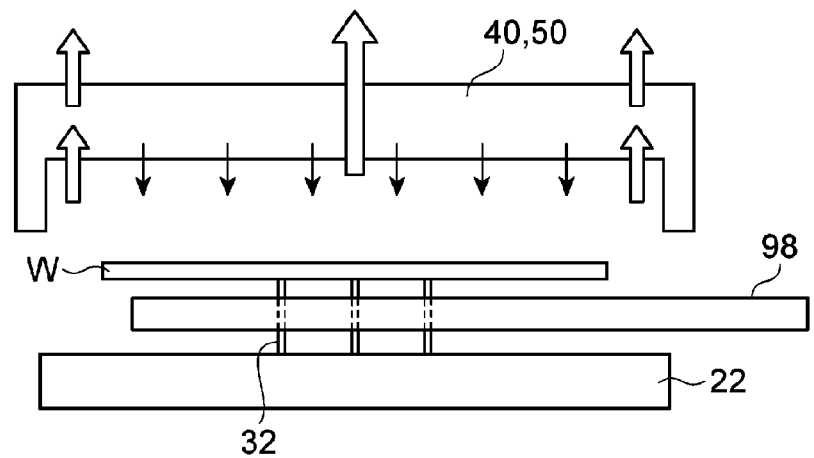

The heat processing unit U2 further includes a cooling plate 98 having a function of cooling the wafer W (see FIG. 9C). The cooling plate 98 reciprocates between a cooling position located outside the chamber 40 and a loading and unloading position of the wafer W in which at least a part of the cooling plate 98 is located in the chamber 40. Alternatively, the cooling plate 98 may be fixed at a position side by side with the hot plate 22 in the horizontal direction, and the heat processing unit U2 may have a transfer arm that transfers the wafer W while moving between the cooling plate 98 and the hot plate 22.

A gas exhaust amount (amount of gas exhausted per unit time) by the central exhauster 80 may be the same as a gas exhaust amount by the outer peripheral exhauster 70, or may be larger than a gas exhaust amount by the outer peripheral exhauster 70. As an example, the gas exhaust amount by the central exhauster 80 may be about 1.1 to 5.0 times the gas exhaust amount by the outer peripheral exhauster 70. In addition, a gas supply amount (amount of gas ejected per unit time) from the gas ejector 50 may be smaller than the gas exhaust amount of each of the outer peripheral exhauster 70 and the central exhauster 80. As an example, the gas supply amount from the gas ejector 50 may be about 1/6 to 1/2 of the gas exhaust amount by the central exhauster 80. In this case, the gas may be suctioned into the chamber 40 through the gap between the lower end of the chamber 40 and the hot plate 22.

(Control Device)

The control device 100 controls respective components of the coating and development apparatus 2 including the heat processing unit U2. The control device 100 is configured to execute: supporting and heating the wafer W covered with the chamber 40 by the heater 20; evacuating the processing space S from the outer peripheral region located outward than the peripheral edge of the wafer W supported on the heater 20; evacuating the processing space S from the central region located inward than the peripheral edge of the wafer W supported on the heater 20; and ejecting the gas from the plurality of ejection holes 54 toward the surface of the wafer W.

As illustrated in FIG. 2, the control device 100 has a functional configuration including a storage 102 and a controller 104. The storage 102 stores a program for operating the respective components of the coating and development apparatus 2 including the heat processing unit U2. The storage 102 also stores various kinds of data (e.g., information related to instruction signals for operating the heat processing unit U2), information from sensors provided in the respective components, and the like. The storage 102 is, for example, a semiconductor memory, an optical recording disc, a magnetic recording disc, or a magneto-optical recording disc. The program may be included in an external storage device separate from the storage 102 or an intangible medium such as a propagation signal. The program may be installed in the storage 102 from other media described above and stored in the storage 102. The controller 104 controls operations of the respective components of the coating and development apparatus 2 based on the program read from the storage 102.

The control device 100 is configured with one or more control computers. For example, the control device 100 includes a circuit 110 illustrated in FIG. 5. The circuit 110 includes one or more processors 112, a memory 114, a storage 116, a timer 122, and an input/output port 118. The storage 116 has a non-transitory computer-readable storage medium such as a hard disc. The storage medium stores a program for causing the control device 100 to execute a substrate processing procedure to be described later, including a heat processing procedure. The non-transitory storage medium may be a removable medium such as nonvolatile semiconductor memory, a magnetic disc, or an optical disc.

The memory 114 temporarily stores a program loaded from the storage medium of the storage 116 and results of arithmetic operations performed by the processor 112. The processor 112 constitutes the above-described functional modules by executing the program in cooperation with the memory 114. The timer 122 measures an elapsed time by counting, for example, a reference pulse having a certain period. The input/output port 118 inputs and outputs electric signals to and from the heat processing unit U2 in response to a command from the processor 112.

The hardware configuration of the control device 100 is not necessarily limited to constituting each functional module by a program. For example, the functional modules of the control device 100 may be constituted by dedicated logic circuits or an application specific integrated circuit (ASIC) in which the dedicated logic circuits are integrated.

[Substrate Processing Procedure]

Figure 6:
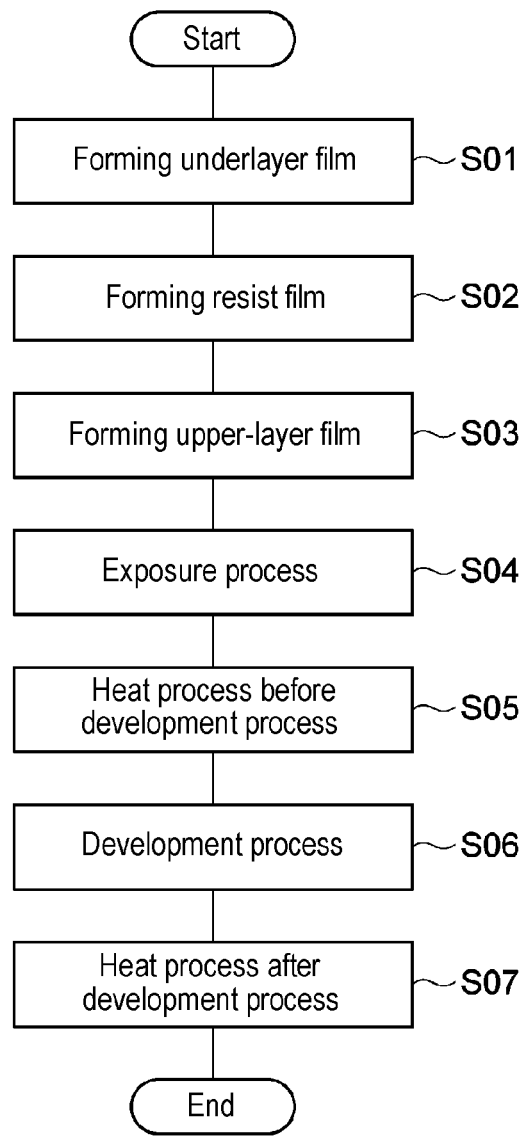
FIG. 6 is a flowchart illustrating an exemplary substrate processing procedure.

FIG. 6 is a flowchart illustrating an exemplary substrate processing procedure including a coating and development process. The control device 100 controls the coating and development apparatus 2 to execute a coating and development process on a sheet of wafer W in the following procedure, for example. First, the controller 104 of the control device 100 controls the transfer device A1 to transfer a wafer W in the carrier C to the shelf unit U10, and controls the transfer device A7 to arrange the wafer W in a cell for the processing module 11.

Next, the controller 104 controls the transfer device A3 to transfer the wafer W in the shelf unit U10 to the coating unit U1 and the heat processing unit U2 in the processing module 11. In addition, the controller 104 controls the coating unit U1 and the heat processing unit U2 to form an underlayer film on the surface of the wafer W (step S01). The heat process (hereinafter referred to as "heat processing procedure") associated with the formation of the underlayer film performed in step S01 will be described later. Thereafter, the controller 104 controls the transfer device A3 to return the wafer W on which the underlayer film is formed to the shelf unit U10, and controls the transfer device A7 to arrange the wafer W in a cell for the processing module 12.

Next, the controller 104 controls the transfer device A3 to transfer the wafer W in the shelf unit U10 to the coating unit U3 and the heat processing unit U4 in the processing module 12. In addition, the controller 104 controls the coating unit U3 and the heat processing unit U4 to form a resist film on the underlayer film of the wafer W (step S02). Thereafter, the controller 104 controls the transfer device A3 to return the wafer W to the shelf unit U10, and controls the transfer device A7 to arrange the wafer W in a cell for the processing module 13.

Next, the controller 104 controls the transfer device A3 to transfer the wafer W in the shelf unit U10 to the respective units in the processing module 13. In addition, the controller 104 controls the coating unit U5 and the heat processing unit U6 to form an upper-layer film on the resist film of the wafer W (step S03). Thereafter, the control device 100 controls the transfer device A3 to transfer the wafer W to shelf unit U11.

Next, the controller 104 controls the transfer device A8 to send the wafer W accommodated in the shelf unit U11 to the exposure apparatus 3. Then, in the exposure apparatus 3, the film formed on the wafer W is subjected to an exposure process (step S04). Thereafter, the controller 104 receives the wafer W having been subjected to the exposure process from the exposure apparatus 3 and controls the transfer device A8 to arrange the wafer W in a cell for the processing module 14 in the shelf unit U11.

Next, the controller 104 controls the transfer device A3 to transfer the wafer W in the shelf unit U11 to the heat processing unit U8 in the processing module 14. Then, the control device 100 controls the heat processing unit U8 to perform a heat process before development on the film of the wafer W (step S05). Next, the controller 104 controls the development unit U7 and the heat processing unit U8 to perform a development process and a heat process after development on the film of the wafer W on which the heat process before development has been performed by the heat processing unit U8 (steps S06 and S07). Thereafter, the controller 104 controls the transfer device A3 to return the wafer W to the shelf unit U10, and controls the transfer device A7 and the transfer device A1 to return the wafer W to the carrier C. As described above, the substrate processing including the coating and development process is completed. The controller 104 may repeatedly execute the processes of steps S01 to S07 with respect to another wafer W (a subsequent wafer W).

(Heat Processing Procedure)

Figure 7:
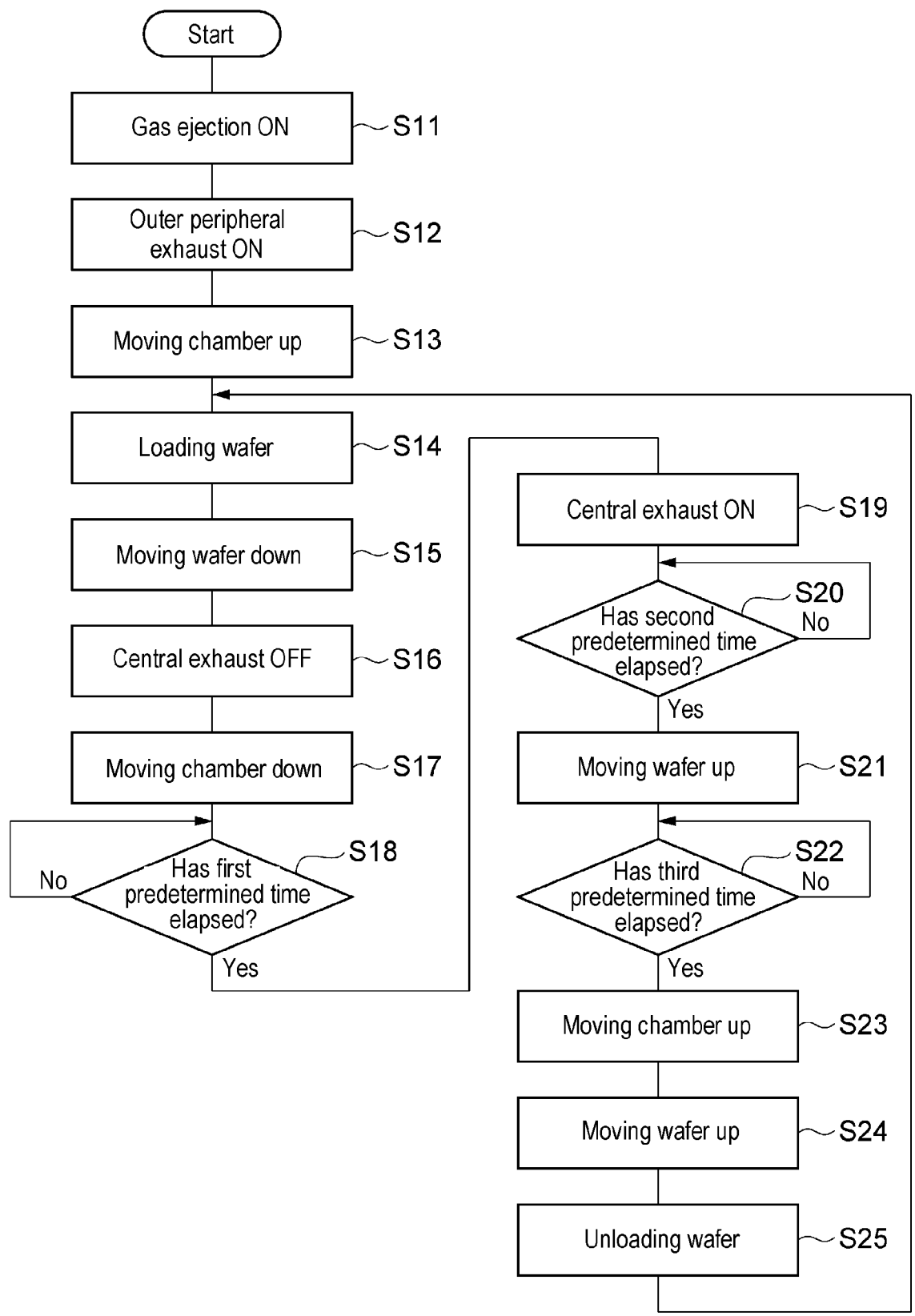
FIG. 7 is a flowchart illustrating an exemplary heat processing procedure.

FIG. 7 is a flowchart illustrating an exemplary heat processing procedure performed in the heat processing unit U2. The flowchart illustrated in FIG. 7 illustrates a procedure when the heat processing unit U2 sequentially performs heat processes on a plurality of wafers W. First, the controller 104 of the control device 100 controls the heat processing unit U2 to eject a gas from the gas ejector 50 in a state in which the hot plate 22 is maintained at a predetermined temperature and the gas is exhausted by the central exhauster 80 (step S11). For example, the controller 104 supplies the gas from the gas source into the buffer space in the head 52 by switching an opening/closing valve provided in the supply path 56 from a closed state to an open state. As a result, the gas is ejected from the plurality of ejection holes 54 formed in the head 52.

Next, the controller 104 controls the exhaust switcher 90 to enable the outer peripheral exhauster 70 to exhaust the gas (step S12). For example, the controller 104 switches the valve 92 provided in the exhaust duct 74 connected to the exhaust holes 72 in the outer peripheral exhauster 70 from the closed state to the open state. As a result, the gas is discharged from a space below the plurality of exhaust holes 72 via the exhaust holes 72. By performing step S12, the exhaust state in the chamber 40 becomes the second state in which the gas is exhausted by the outer peripheral exhauster 70 and the central exhauster 80. In the subsequent steps, the controller 104 continues the gas ejection from the gas ejector 50 and the gas exhaustion from the outer peripheral exhauster 70 while maintaining the temperature of the hot plate 22 at a predetermined temperature according to a processing condition stored in the storage 102. In the second state, the gas ejected from the gas ejector 50 is mainly discharged from the central exhauster 80. In addition, when a gap is formed between the side wall 44 and the hot plate 22, the gas that has entered the chamber 40 through the gap is exhausted from both of the outer peripheral exhauster 70 and the central exhauster 80. Therefore, in the chamber 40, a gas flow mainly directed from the outer peripheral side toward the inner peripheral side (central side) is formed.

Next, the controller 104 controls the chamber driver 48 to move up the chamber 40 (step S13). For example, the controller 104 controls the chamber driver 48 to switch from the closed state in which the processing space S is formed by the chamber 40 to the open state in which the chamber 40 is separated from the heater 20 (hot plate 22).

Next, the controller 104 controls the heat processing unit U2 such that a wafer W, which is a processing target and on which a film of a processing liquid is formed, is loaded into the chamber 40 (step S14). For example, the controller 104 controls the heat processing unit U2 to insert the cooling plate 98, on which the wafer W as a processing target is placed, into a space between the hot plate 22 and the chamber 40 (to dispose the cooling plate 98 at the loading and unloading position). Then, the controller 104 moves the support pins 32 up by the lifting driver 34 such that the support pins 32 receive the wafer W on the cooling plate 98 disposed above the hot plate 22. As a result, the wafer W as a processing target is loaded into the chamber 40.

Next, the controller 104 controls the lifting driver 34 to move the wafer W down (step S15). Specifically, the controller 104 moves down the support pins 32 supporting the wafer W by the lifting driver 34 such that the wafer W is placed on the mounting surface 22*a* of the hot plate 22.

Next, the controller 104 controls the exhaust switcher 90 such that the gas exhaustion from the central exhauster 80 is stopped (step S16). For example, the controller 104 switches the valve 94 from the open state to the closed state such that the gas exhaust from the central exhauster 80 is stopped. As a result, in the exhauster 60, no gas is discharged from the exhaust hole 82, and the gas is discharged from the plurality of exhaust holes 72. That is, the exhaust state in the chamber 40 is switched from the second state to the first state in which the central exhauster 80 does not exhaust the gas and the gas is exhausted from the outer peripheral exhauster 70.

Figure 8A:
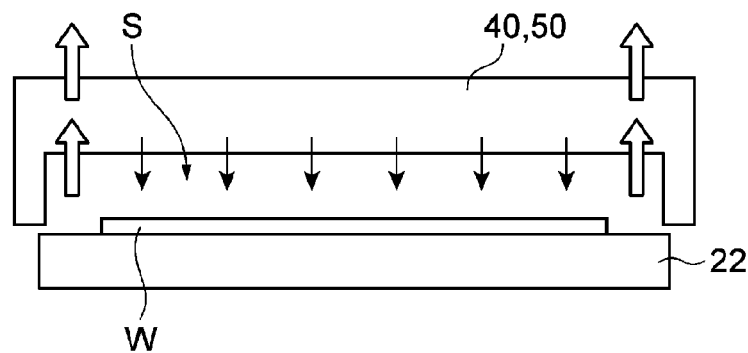
FIGS. 8A to 8C are schematic views illustrating an exemplary operation of respective components and flow of gas in a heat processing procedure.

Next, the controller 104 controls the chamber driver 48 to move the chamber 40 down (step S17). For example, the controller 104 controls the chamber driver 48 to switch from the open state to the closed state in which the processing space S is formed, as illustrated in FIG. 8A. As a result, heating the wafer W as a processing target is started. By performing steps S11 to S17, the heat process is started in a state in which the central exhauster 80 does not exhaust the gas and the gas is exhausted from the outer peripheral exhauster 70 while the gas is ejected from the gas ejector 50. In the first state, the gas ejected from the gas ejector 50 and the gas entering the chamber 40 through the gap formed between the side wall 44 and the hot plate 22 are discharged from the outer peripheral exhauster 70. Therefore, a gentle gas flow toward the outer peripheral side is formed on the surface of the wafer W.

Next, the controller 104 waits until a first predetermined time elapses after moving down the chamber 40 is completed (after heating the wafer W is started). The first predetermined time is stored in the storage 102. The first predetermined time is set to such an extent that the film on the wafer W solidifies at a predetermined level. While the controller 104 waits until the first predetermined time elapses, the first state in which the processing space S is evacuated from the outer peripheral exhauster 70, continues. During the first predetermined time the gas is ejected from the plurality of ejection holes 54 toward the surface of the wafer W on the hot plate 22 by the gas ejector 50, while the gas is not exhausted from the central region and is exhausted from the outer peripheral region. The solidification (formation) of the film on the wafer W proceeds further in an initial stage from the start of heating the wafer W. As described above, by setting the exhaust state in the initial stage to be the first state in which the processing space S is evacuated from the outer peripheral region without being evacuated from the central region, in the initial stage, it is possible to suppress the influence of the gas flow generated by the gas exhaustion on the formation of the film.

After the elapse of the first predetermined time, the controller 104 switches the gas exhaustion by the central exhauster 80 from a stopped state to an exhaust state (step S19). Specifically, the controller 104 switches the valve 94 from the closed state to the open state such that the gas is exhausted from the central exhauster 80. That is, the controller 104 controls the exhaust switcher 90 such that the exhaust state in the chamber 40 is switched from the first state to the second state while ejecting the gas from the plurality of ejection holes 54 by the gas ejector 50.

Figure 8B:
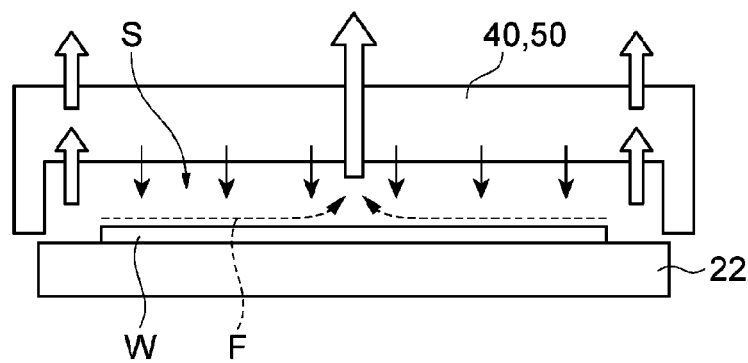

Next, the controller 104 waits until a second predetermined time elapses after switching to the second state (after starting the gas exhaust by the central exhauster 80) (step S20). The second predetermined time is stored in the storage 102. The second predetermined time is set to such an extent that the film on the wafer W solidifies to a level desired in the heat process. While the controller 104 waits until the second predetermined time elapses, the second state in which the processing space S is evacuated from the outer peripheral exhauster 70 and the central exhauster 80 continues. During the second predetermined time, as illustrated in FIG. 8B, while the gas is exhausted from the central region and the peripheral region, the gas is ejected toward the surface of the wafer W on the hot plate 22 from the ejection holes 54 by the gas ejector 50. In the step (latter stage) in which the solidification of the film on the wafer W progresses to the extent that the influence of the gas flow on the film becomes smaller than that in the initial stage, by switching the exhaust state to the second state in which the gas is additionally exhausted from the central region, it is possible to effectively discharge the sublimate. As described above, in the second state, in the vicinity of the surface of the wafer W, a gas flow directed from the outer peripheral side of the wafer W toward the inner peripheral side (central side) thereof is formed. By utilizing this gas flow, it is possible to discharge the sublimate from the central exhauster 80.

Figure 8C:
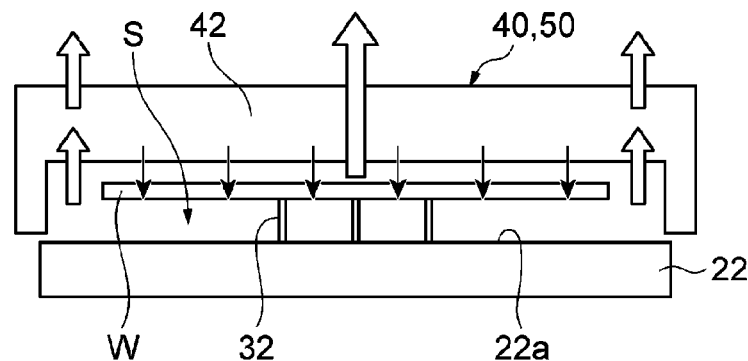

After the elapse of the second predetermined time, the controller 104 controls the lifting driver 34 to move the wafer W up (step S21). Specifically, as illustrated in FIG. 8C, the controller 104 moves the support pins 32 up by the lifting driver 34 to move up the wafer W from the heater 20 (the hot plate 22) so as to bring the wafer W close to the ceiling plate 42 of the chamber 40. For example, the controller 104 moves the wafer W up by the lifting driver 34 to a standby position set between the processing position where heating the wafer W is performed and the delivery position where loading and unloading the wafer W is performed. At this time, the controller 104 controls the chamber driver 48 to maintain the closed state in which the processing space S is formed by the chamber 40. The controller 104 controls the lifting driver 34 to move the wafer W up so as to bring the wafer W closer to the ceiling plate 42 while continuing the gas exhaustion from the central region and the outer peripheral region. In step S21, heating the wafer W as a processing target by the heater 20 is completed by separating the wafer W from the mounting surface 22a. In addition, in a state in which the wafer W is moved to the standby position, movement of the gas ejected from the gas ejector 50 along the surface of the wafer W and the gas exhaustion from the central exhauster 80 are promoted. Therefore, the discharge of the sublimate from the central exhauster 80 is promoted.

Next, the controller 104 waits until a third predetermined time elapses after moving up the wafer W to the standby position (step S22). The third predetermined time is stored in the storage 102. The third predetermined time period is set to such an extent that generation of the sublimate from the film on the wafer W is sufficiently reduced by a decrease in the temperature of the wafer W heated by the hot plate 22. The third predetermined time may be set to several seconds to several tens of seconds. As an example, the third predetermined time may be 1 to 10 seconds, may be 1.5 to 8 seconds, or may be 2 to 6 seconds from the viewpoint of both of recovering the sublimate and maintaining the throughput. As described above, the controller 104 controls the heat processing unit U2 such that the state in which the wafer W is brought closer to the ceiling plate 42 is continued for the third predetermined time.

After the elapse of the third predetermined time, the controller 104 controls the chamber driver 48 to move the wafer W up (step S23). Specifically, as illustrated in FIG. 9A, the controller 104 controls the chamber driver 48 to switch from the closed state in which the chamber 40 is closer to the hot plate 22 to the open state in which the chamber 40 is separated from the hot plate 22, such that the processing space S is open to the outside of the chamber 40. As described above, the controller 104 performs the switching from the closed state to the open state by the chamber driver 48 after the wafer W is brought closer to the ceiling plate 42 (more specifically, after the state in which the wafer W is brought closer to the ceiling plate 42 continues).

Next, the controller 104 controls the lifting driver 34 to move up the wafer W located at the standby position (step S24). Specifically, as illustrated in FIG. 9B, the controller 104 controls the lifting driver 34 to move up the support pins 32 supporting the wafer W so as to move up the wafer W from the standby position to the delivery position.

Next, the controller 104 controls the heat processing unit U2 to unload the wafer W located at the delivery position to the outside of the chamber 40 (step S25). For example, the controller 104 controls a driver configured to move the cooling plate 98 to insert the cooling plate 98 into the chamber 40 (a space between the wafer W supported on the support pins 32 and the hot plate 22) via a gap between the chamber 40 and the hot plate 22, as illustrated in FIG. 9C. Then, the controller 104 causes the support pins 32 supporting the wafer W to be moved down by the lifting driver 34. As a result, the wafer W is delivered from the support pins 32 to the cooling plate 98. Thereafter, the controller 104 controls the driver to move the cooling plate 98 holding the wafer W to the outside of the chamber 40. As a result, the wafer W as a processing target is unloaded from the chamber 40. Consequently, a series of heat processes for the first sheet of wafer W is completed.

After the end of step S25, the controller 104 repeats the series of processes including steps S14 to S25. As a result, the heat processes are sequentially performed on a plurality of wafers W. Steps S22 to S25 in one series of heat processes and steps S14 to S17 in a subsequent series of heat processes are processes for exchanging wafers W as processing targets. During the period in which the wafers W as processing target are replaced, the controller 104 causes the gas ejector 50 to continue the gas ejection from the plurality of ejection holes 54 and causes the outer peripheral exhauster 70 to continue the gas exhaustion.

Effect of First Embodiment

The coating and development apparatus 2 according to the first embodiment described above includes the heat processing unit U2 configured to perform the heat processes on the wafer W having a film formed thereon, and the control device 100 configured to control the heat processing unit U2. The heat processing unit U2 includes: the heater 20 configured to support and heat the wafer W; the chamber 40 configured to cover the wafer W supported on the heater 20;

the gas ejector 50 having the head 52 in which the plurality of ejection holes 54 scattered along a surface facing the wafer W supported on the heater 20 are formed, the gas ejector 50 being configured to eject a gas from the plurality of ejection holes 54 to the surface of the wafer W; the outer peripheral exhauster 70 configured to evacuate the processing space S inside the chamber 40 from the outer peripheral region located outward than the peripheral edge of the wafer W supported on the heater 20; and the central exhauster 80 configured to evacuate the processing space S from the central region located inward than the peripheral edge of the wafer W supported on the heater 20.

The substrate processing procedure according to the first embodiment described above includes performing heat processes on the wafer W having a film formed thereon. Performing the heat processes on the wafer W includes: causing the wafer W to be supported on and heated by the heater 20 in the state in which the wafer W is covered by the chamber 40; evacuating the processing space S from the outer peripheral region located outward than the peripheral edge of the wafer W supported on the heater 20; evacuating the processing space S from the central region located inward than the peripheral edge of the wafer W supported on the heater 20; and ejecting the gas toward the surface of the wafer W from the plurality of ejection holes 54 scattered along a surface facing the wafer W supported on the heater 20.

In the coating and development apparatus 2 and the substrate processing procedure, the sublimate from the film is efficiently recovered by exhausting the gas from the central region as well during at least a part of the heat processes on the wafer W as a processing target. In addition, by ejecting the gas from the gas ejector 50 onto the surface of the wafer W, it is possible to reduce the influence of the gas flow accompanying the gas exhaustion from the central region on the film thickness. Therefore, it is possible to improve uniformity in thickness of a film as a heat processing target while efficiently recovering the sublimate.

The sublimate can be efficiently recovered by exhausting the gas from the central region, but the uniformity in thickness of the film on the wafer W is affected by the gas flow on the wafer W generated by performing a central exhaustion (the gas exhaustion from the central region). Specifically, the gas flow generated due to the central exhaustion flows upward as the gas flows from the peripheral edge of the wafer W toward the approximate center thereof. For this reason, the distance between a boundary layer of the gas flow and the surface of the wafer W varies in the plane of the wafer W, and the amount of volatile components of the film on the wafer W may be made uneven. In this case, the thickness of the film on the wafer W tends to increase toward the center of the wafer W.

In contrast, in the coating and development apparatus 2 and the substrate processing procedure, the gas is ejected from the plurality of ejection holes 54 scattered along the surface facing the surface of the wafer W. The gas flow (hereinafter, referred to as "gas flow F") generated due to the gas exhaustion from the central region tends to rise from the peripheral edge of the wafer W toward the center of the wafer W. However, as illustrated in FIG. 8B, the rise of the gas flow F is suppressed over the substantially entire surface of the wafer W by the ejection of the gas from the plurality of ejection holes 54. Therefore, the difference in the distance between the boundary layer of the gas flow F generated due to the central exhaustion and the surface of the wafer W in the plane of the wafer W is reduced. As a result, variation in film thickness in the plane of the wafer W due to the central exhaustion is suppressed. Therefore, it is possible to improve the uniformity in thickness of a film as a processing target while efficiently recovering the sublimate.

In the first embodiment described above, the heat processing unit U2 further includes the exhaust switcher 90 configured to switch the exhaust state between a first state in which the processing space S is evacuated from the outer peripheral exhauster 70 and a second state in which the processing space S is evacuated at least from the central exhauster 80. The control device 100 controls the exhaust switcher 90 to switch from the first state to the second state while causing the gas ejector 50 to eject the gas from the plurality of ejection holes 54. By switching from the first state to the second state in the latter stage of heating the wafer W as a processing target, the processing space S is evacuated from the central exhauster 80. Thus, it is possible to efficiently recover the sublimate from the film on the wafer W. Meanwhile, since film formation is progressing in the latter stage of heating the wafer W, the influence of the gas flow accompanying the gas exhaustion on the variation in film thickness becomes small. Therefore, it is possible to further improve the uniformity in thickness of a film as a heat processing target while efficiently recovering the sublimate.

In the embodiment described above, the gas exhaustion from the outer peripheral exhauster 70 continues even in the second state, whereby the gas is exhausted from both the central exhauster 80 and the outer peripheral exhauster 70. In this state, it is possible to suppress turbulence of the gas flow caused by the change in the gas flow in the processing space S when the exhaust state is switched from the first state to the second state. Therefore, it is possible to prevent deterioration of the uniformity in the thickness of the film as a heat processing target due to the turbulence of the gas flow generated when the exhaust state is switched. In particular, as in the above-described embodiment, in the case of a structure in which a gap is formed between the side wall 44 and the hot plate 22 and the gas enters the chamber 40 through the gap, an upward flow is formed by exhausting the gas from the outer peripheral exhauster 70. Therefore, by continuing the gas exhaustion from the outer peripheral exhauster 70 even in the second state, the upward flow, which is generated by exhausting the gas entering the chamber 40 through the gap by the outer peripheral exhauster 70, is continuously formed at the outer periphery of the wafer W. Therefore, it is possible to further suppress the turbulence of the gas flow in the vicinity of the surface of the wafer W located inward than the upward flow.

In the first embodiment described above, the heat processing unit U2 further includes the substrate lifter 30 configured to move the wafer W up and down, and the chamber driver 48 configured to switch between the closed state in which the processing space S is formed by the chamber 40 and the open state in which the chamber 40 is separated from the heater 20 compared to the closed state. The chamber 40 includes the ceiling plate 42 provided with the head 52. The control device 100 controls the substrate lifter 30 to move up the wafer W from the heater 20 and to bring the wafer W closer to the ceiling plate 42, and controls the chamber driver 48 to switch from the closed state to the open state after bringing the wafer W closer to the ceiling plate 42. Since the wafer W after heating the wafer W is completed by moving up the wafer W from the heater 20 still has a heat, the sublimate may be generated even after the heating is completed. In the configuration described above, since the wafer W is brought closer to the chamber 40 after the wafer W is moved up from the heater 20, it is possible to confine the sublimate generated even after the heating is completed in the chamber 40 and exhaust the sublimate to the outside of the chamber 40. Therefore, it is possible to suppress contamination of the heat processing unit U2 by the sublimate from the film on the wafer W.

In the first embodiment described above, the heat processing unit U2 sequentially performs the heat processes on a plurality of wafers W including the wafer W described above. The control device 100 causes the gas ejector 50 to continuously eject the gas from the plurality of ejection holes 54 during the period in which the wafer W as a processing target is replaced. In this case, the change in ambient temperature caused by the gas ejection from the gas ejector 50 is maintained substantially constant. Therefore, the results of the heat processes can be stabilized among the wafers W. For example, when the head 52 of the gas ejector 50 is provided on the ceiling plate 42, change in temperature of the chamber 40 based on whether or not the gas is ejected from the gas ejector 50 does not occur during the wafer W replacement period. Therefore, it is easy to maintain the temperature of the chamber 40 substantially constant during the continuously performed heat processes, and the heat processes of the wafers W can be stabilized.

In the heat processing procedure according to the first embodiment described above, performing the heat processes on the wafer W further includes switching the exhaust state from the first state in which the processing space S is evacuated from the outer peripheral region to the second state in which the processing space S is evacuated at least from the central region, while ejecting the gas toward the surface of the wafer W from the plurality of ejection holes 54. In this case, like the coating and development apparatus 2, it is possible to further improve the uniformity of the thickness of a film as a heat processing target while efficiently recovering the sublimate.

In the first embodiment described above, performing the heat processes on the wafer W further includes bringing the wafer W closer to the ceiling plate 42 of the chamber 40 by moving up the wafer W from the heater 20, and after bringing the wafer W closer to the ceiling plate 42, switching from the closed state in which the processing space S is formed by the chamber 40 to the open state in which the chamber 40 is separated from the heater 20 compared with the closed state. In this case, like the coating and development apparatus 2 described above, it is possible to suppress contamination of the heat processing unit U2 by the sublimate from the film.

In the first embodiment described above, the substrate processing procedure includes sequentially performing the heat processes on a plurality of wafers W. Sequentially performing the heat processes on the plurality of wafers W may include continuously ejecting the gas from the plurality of ejection holes 54 during the period in which the wafer W as a processing target is replaced. In this case, like the coating and development apparatus 2, the results of the heat processes can be stabilized among the wafers W.

In the first embodiment described above, after the heat processes on the underlayer film is performed in the heat processing unit U2, a resist is applied to the surface of the wafer W on which the underlayer film is formed by the coating unit U1 of the processing module 12, and thus a resist film is formed. Depending on the type of the underlayer film, a processing liquid from which a sublimate is more easily generated may be used. Alternatively, a processing liquid having high sensitivity to a gas flow may be used. In the case of forming the underlayer film using such a processing liquid, the coating and development apparatus 2 and the substrate processing procedure according to the first embodiment described above are more useful for achieving both efficient recovery of the sublimate and the uniformity in film thickness.

(Modification)

Figure 10:
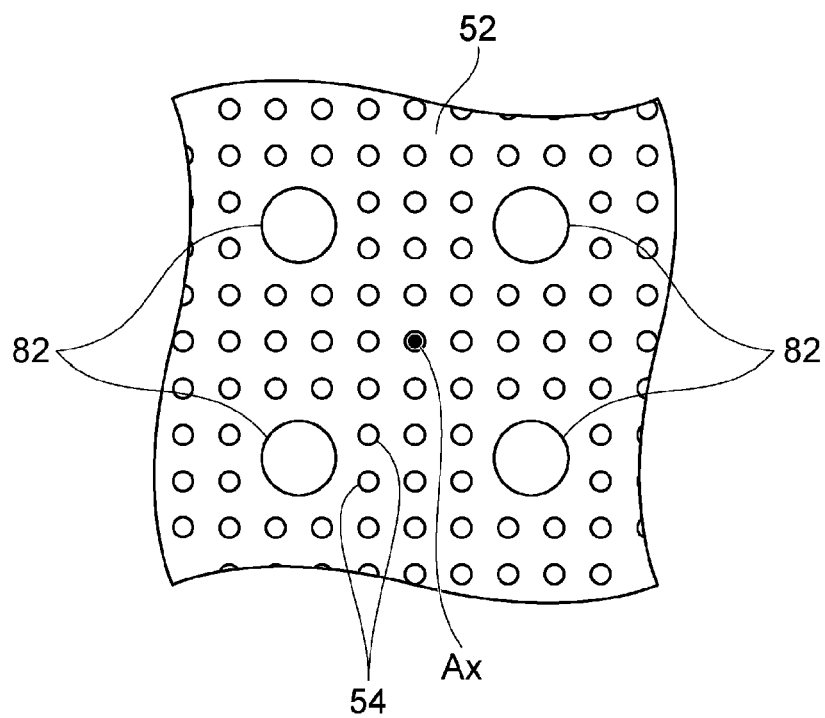
FIG. 10 is a schematic view illustrating another exemplary gas ejector.

The configuration of the central exhauster 80 is not limited to the example described above. In the central exhauster 80, instead of the single exhaust hole 82, evacuation of the processing space S may be performed from a plurality of exhaust holes 82 (a plurality of central exhaust holes) provided in the head 52 (the ceiling plate 42) of the gas ejector 50. As illustrated in FIG. 10, for example, the plurality of exhaust holes 82 may be provided in the head 52 so as to surround the central axis Ax. Each of the exhaust holes 82 is eccentric from the central axis Ax. The exhaust holes 82 may be arranged at equal intervals in the circumferential direction of the central axis Ax. The size of each of the exhaust holes 82 may be larger than that of the ejection holes 54. One or more ejection holes 54 may be arranged between adjacent exhaust holes 82 among the plurality of exhaust holes 82. The head 52 may be provided with a plurality of exhaust holes 82 arranged around the central axis Ax and an exhaust hole 82 arranged on the central axis Ax.

Due to the gas flow flowing toward the exhaust holes 82 in the central exhauster 80, the film thickness at locations corresponding to the exhaust holes 82 in the film on the wafer W tends to protrude more than other portions. By evacuating the processing space S from the central region by the exhaust holes 82, when the total exhaust amount is the same, the exhaust amount per unit time from each exhaust hole 82 is reduced. Therefore, the gas flow directed toward each exhaust hole 82 is weakened, and the amount of protrusion of the film thickness at the location corresponding to one exhaust hole 82 can be reduced.

As illustrated in FIG. 11, the gas ejector 50 may further include nozzles 58 configured to eject the gas to the lower side of the exhaust holes 82. Each nozzle 58 may be formed in a tubular shape so as to connect the buffer space in the head 52 and the processing space S. Alternatively, each nozzle 58 may be an ejection hole that penetrates the bottom surface of the head 52 in a vertically oblique direction. A plurality of nozzles 58 may be arranged to surround one exhaust hole 82. The amount of gas ejected from each nozzle 58 may be substantially the same as the amount of gas ejected from each ejection hole 54, or may be different from the amount of gas ejected from each ejection hole 54. The controller 104 causes the gas ejector 50 to supply the gas from the ejection holes 54 and the nozzles 58 to the processing space S while the heat processes are performed on the wafer W. In the head 52 illustrated in FIG. 11, when the gas is supplied from the gas source to the buffer space in the head 52, the gas is ejected to the processing space S from the plurality of ejection holes 54 and the plurality of nozzles 58.

In the above-described configuration, the central exhauster 80 includes the exhaust holes 82 provided in the head 52 so as to be open to the processing space S. The gas ejector 50 further includes the nozzles 58 configured to eject the gas toward the lower side of the exhaust holes 82. The gas ejected from the nozzles 58 to the lower side of the exhaust holes 82 weakens the gas flow directed toward the exhaust holes 82 from the lower side of the exhaust holes 82. As a result, it is possible to suppress the amount of protrusion of the film thickness at the locations corresponding to the exhaust holes 82. Therefore, it is possible to further improve the uniformity in film thickness in the plane of the wafer W.

In the heat processing procedure performed by the heat processing unit U2 having the configuration described above, evacuating the processing space S from the central region includes discharging the gas within the processing space S through the exhaust holes 82 provided in the head 52 in which the plurality of ejection holes 54 is formed, and ejecting the gas from the nozzles 58 toward the lower side of the exhaust holes 82. In this case as well, it is possible to further improve the uniformity in film thickness in the plane of the wafer W.

In the example described above, the density of the plurality of ejection holes 54 is substantially uniform over the entire surface of the ceiling plate 42 in the portion facing the wafer W ("facing portion"). However, the density of the plurality of ejection holes 54 in a region in the vicinity of the exhaust holes 82 in the central exhauster 80 may be higher than that in other regions. Specifically, a ratio occupied by the opening area of the ejection holes 54 in the region (vicinity region) in the vicinity of the exhaust holes 82 (a ratio of the opening area of the ejection holes 54 to the total area of the vicinity region) may be larger than a ratio occupied by the opening area of the ejection holes 54 in a region other than the vicinity region.

The above-mentioned vicinity region of the exhaust holes 82 may be set to a region facing a portion of the wafer W having a film thickness affected by the gas exhaustion through the exhaust holes 82. As an example, in the case where one exhaust hole 82 is provided on the central axis Ax, the vicinity region of the exhaust holes 82 may be set to be within a range having a radius about 2 to 10 times the radius of the exhaust hole 82, with the central axis Ax as the center. Alternatively, in the case where a plurality of exhaust holes 82 is provided around the central axis Ax, the vicinity region of the exhaust holes 82 may be set to be within a range having a radius about 1.1 to 5 times the distance between the central axis Ax and the center of each exhaust hole 82, with the central axis Ax as the center. The vicinity region of the exhaust holes 82 may be set to be within a range having a radius of about ⅙ to ⅓ times the radius of the wafer W. The location of the vicinity region in which the plurality of ejection holes 54 is densely arranged may be changed depending on arrangement positions of the exhaust holes 82.

In the configuration described above, the density of the plurality of ejection holes 54 in the region in the vicinity of the exhaust holes 82 is higher than the density of the plurality of ejection holes 54 in other regions. Therefore, the gas flow directed to the exhaust holes 82 from the lower side of the exhaust holes 82 is weakened. As a result, it is possible to suppress the amount of protrusion of the film thickness at the locations corresponding to the exhaust holes 82. Therefore, it is possible to further improve the uniformity in film thickness in the plane of the wafer W.

Figure 12A:
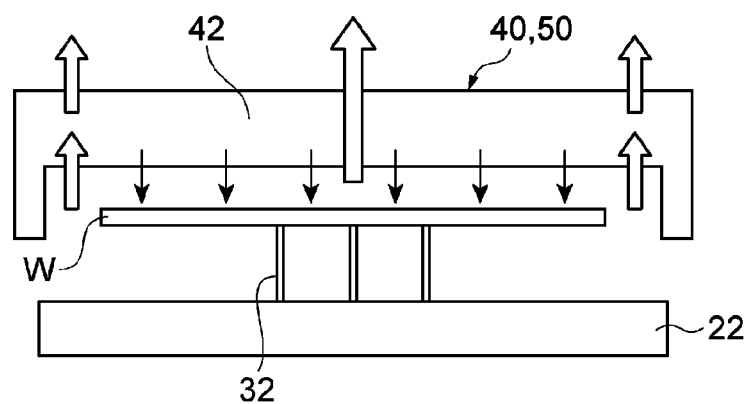
FIGS. 12A and 12B are schematic views illustrating another exemplary operation of respective components in a heat processing procedure.

The method of bringing a wafer W as a processing target closer to the ceiling plate 42 after heating the wafer W is not limited to the above example. After step S20 illustrated in FIG. 7 (after the second state is continued for the second predetermined time), the controller 104 may cause the wafer W and the chamber 40 to be moved up substantially simultaneously while maintaining the state in which the wafer W is surrounded by the chamber 40, as illustrated in FIG. 12A. For example, the controller 104 controls the substrate lifter 30 to move the wafer W up so as to bring the wafer W closer to the ceiling plate 42 while maintaining the chamber 40 in the closed state. In addition, without waiting for a predetermined time after the wafer W is brought closer to the ceiling plate 42, the controller 104 controls the substrate lifter 30 and the chamber driver 48 to move up the wafer W and the chamber 40 at the approximately same speed. As an example, the controller 104 moves up the wafer W and the chamber 40 until the wafer W is placed at the delivery position.

Figure 12B:
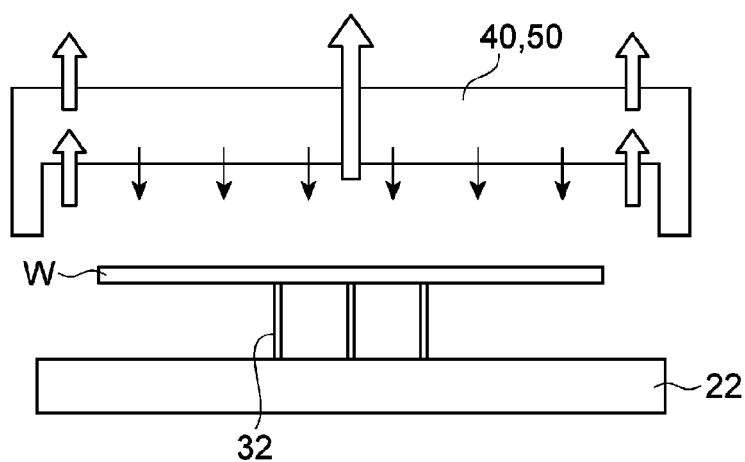

In addition, the controller 104 may continue the state in which the wafer W is placed at the delivery position and is brought closer to the ceiling plate 42 for a predetermined time. Thereafter, as illustrated in FIG. 12B, the controller 104 may further move up the chamber 40 by controlling the chamber driver 48 while maintaining the wafer W at the delivery position. In this case as well, it is possible to suppress the contamination of the heat processing unit U2 due to the sublimate from the film.

In the above description, the underlayer film formed on the wafer W is described as an example of a heat processing target. However, the film as a heat processing target may be a resist film, an upper-layer film, and a film of a developer, which are subjected to heat processes in the processing modules 12, 13, and 14, respectively, or may be another film on the wafer W. Like the heat processing unit U2, each of the heat processing units U4, U6, and U8 may have a chamber 40 including a gas ejector 50 and an exhauster 60. The substrate as a processing target is not limited to a semiconductor wafer, and may be, for example, a glass substrate, a mask substrate, or a flat panel display (FPD).

Second Embodiment

Figure 13:
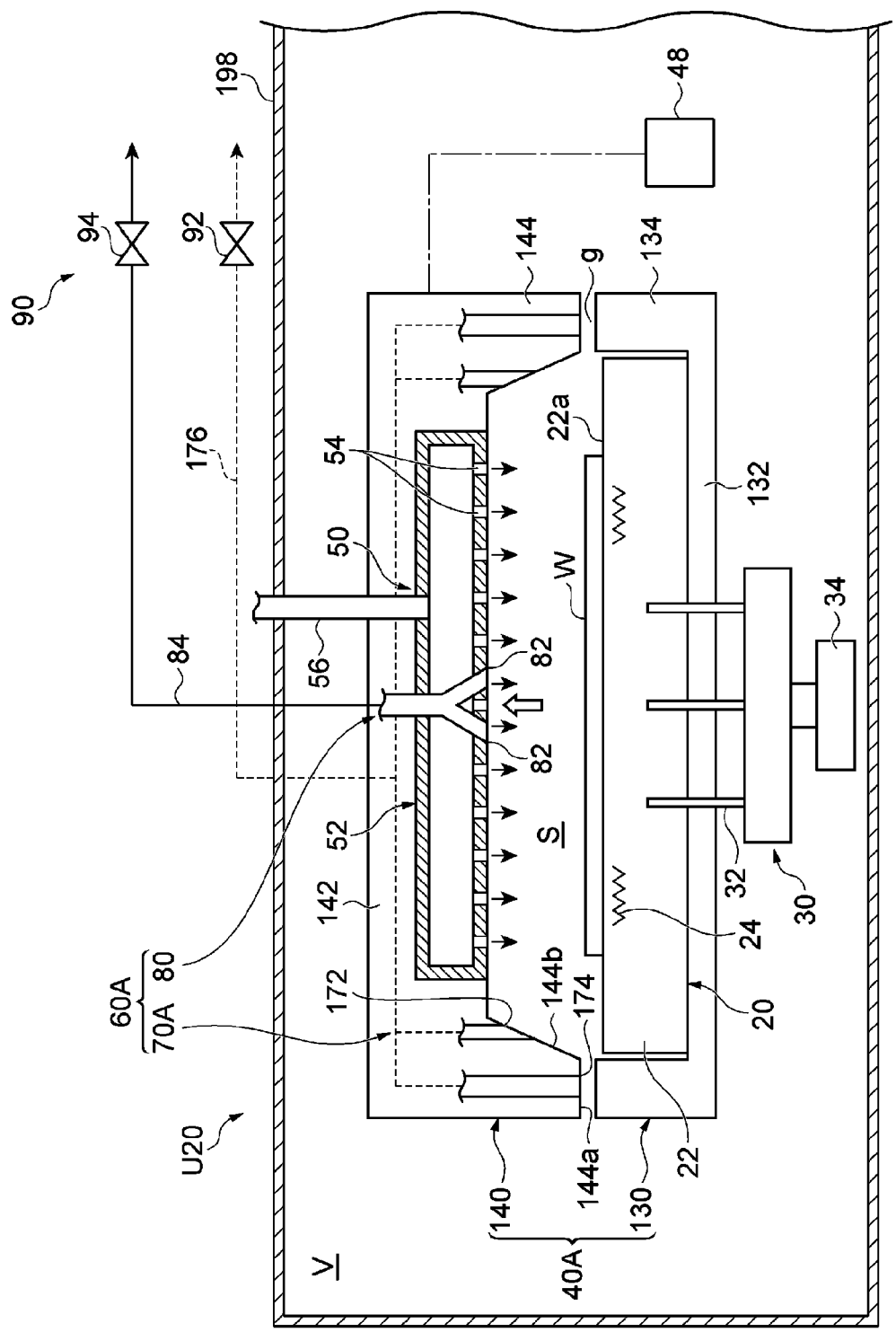
FIG. 13 is a schematic view illustrating an exemplary heat processing unit included in a substrate processing system according to a second embodiment.

Next, a substrate processing system according to a second embodiment will be described with reference to FIGS. 13 to 18B. The substrate processing system according to the second embodiment is different from the substrate processing system 1 according to the first embodiment in that the processing module 11 has a heat processing unit U20, instead of the heat processing unit U2. As shown in FIG. 13, the heat processing unit U20 includes, for example, a housing 198, a heater 20, a substrate lifter 30, a chamber 40A, and an exhauster 60A. The housing 198 accommodates at least the heater 20, the substrate lifter 30, and the chamber 40A. In this case, the chamber 40A is arranged in an accommodation space V formed by the housing 198.

Like the chamber 40, the chamber 40A covers a wafer W supported on the heater 20 to form a processing space S for performing heat processes on the hot plate 22. The chamber 40A covers the wafer W on the heater 20 in a state in which a communication portion, which connects the processing space S and a space outside the chamber 40A (more specifically, a space inside the accommodation space V and outside the chamber 40A), is formed in an outer peripheral region of the chamber 40A. The chamber 40A has, for example, a holder 130 and a lid 140.

The holder 130 holds the hot plate 22 of the heater 20 at a predetermined position. The holder 130 includes, for example, a support bottom wall 132 and a peripheral wall 134. The support bottom wall 132 is formed in a shape of a disc having a diameter similar to that of the hot plate 22. The support bottom wall 132 is arranged so as to face (contact) a rear surface of the hot plate 22 opposite to the mounting surface 22a, and supports the rear surface. The peripheral wall 134 is formed so as to extend upward from the outer edge of the support bottom wall 132. The peripheral wall 134 is formed in an annular shape and has a height similar to the thickness of the hot plate 22. The peripheral wall 134 surrounds the periphery of the hot plate 22. For example, the inner peripheral surface of the peripheral wall 134 and the outer peripheral surface of the hot plate 22 face each other. A gap may be formed between the inner peripheral surface of the peripheral wall 134 and the outer peripheral surface of the hot plate 22.

The lid 140 is arranged in a state in which a gap g is provided between the lid 140 and the holder 130 so as to cover the wafer W on the heater 20 from above when the processing space S is formed. The lid 140 includes, for example, a ceiling plate 142 and a side wall 144. The ceiling plate 142 is formed to be similar to the ceiling plate 42 described above. That is, the head 52 of the gas ejector 50 is provided in the ceiling plate 142.

Like the side wall 44 described above, the side wall 144 is formed to extend downward from the outer edge of the ceiling plate 142. The side wall 144 is formed in an annular shape and surrounds the mounting surface 22a. FIG. 13 illustrates an exemplary arrangement of the lid 140 when the processing space S is formed. In this arrangement, a lower end surface 144a of the side wall 144 faces the upper end surface of the peripheral wall 134 of the holder 130 in a state of being located adjacent to the upper end surface of the peripheral wall 134. Specifically, a gap g is formed between the lower end surface 144a of the side wall 144 and the upper end surface of the peripheral wall 134, and the gap g serves as the communication portion, which connects the processing space S and the space outside the chamber 40A.

An inner peripheral surface 144b of the side wall 144 is inclined with respect to the vertical direction such that the distance between the center (central axis Ax) of the ceiling plate 142 and the inner peripheral surface 144b in the horizontal direction becomes smaller from the lower end of the side wall 144 toward the ceiling plate 142. In this case, the inner diameter of the side wall 144 becomes smaller from the lower end of the side wall 144 toward the ceiling plate 142.

The lid 140 is provided in the housing 198 so as to be movable in the vertical direction. The chamber driver 48 of the heat processing unit U20 moves the lid 140 in the vertical direction. The chamber driver 48 moves the lid 140 down until the side wall 144 of the lid 140 approaches the peripheral wall 134. Thus, the processing space S is formed by the chamber 40A (the chamber 40A enter a closed state). When the chamber driver 48 moves the lid 140 up such that the side wall 144 of the lid 140 is separated from the peripheral wall 134, the space on the hot plate 22 is open to the space outside the chamber 40A (the chamber 40A enters an open state).

The exhauster 60A differs from the exhauster 60 according to the first embodiment in that the former has an outer peripheral exhauster 70A instead of the outer peripheral exhauster 70. FIG. 13 illustrates a case where the central exhauster 80 of the exhauster 60A has therein a plurality of exhaust holes 82 (central exhaust holes). Like the outer peripheral exhauster 70, the outer peripheral exhauster 70A exhausts the gas in the processing space S from the outer peripheral region located outward than the peripheral edge of the wafer W supported on the heater 20. The outer peripheral exhauster 70A has a plurality of first exhaust holes 172 and a plurality of second exhaust holes 174 provided outward than the head 52 of the gas ejector 50.

Figure 14:
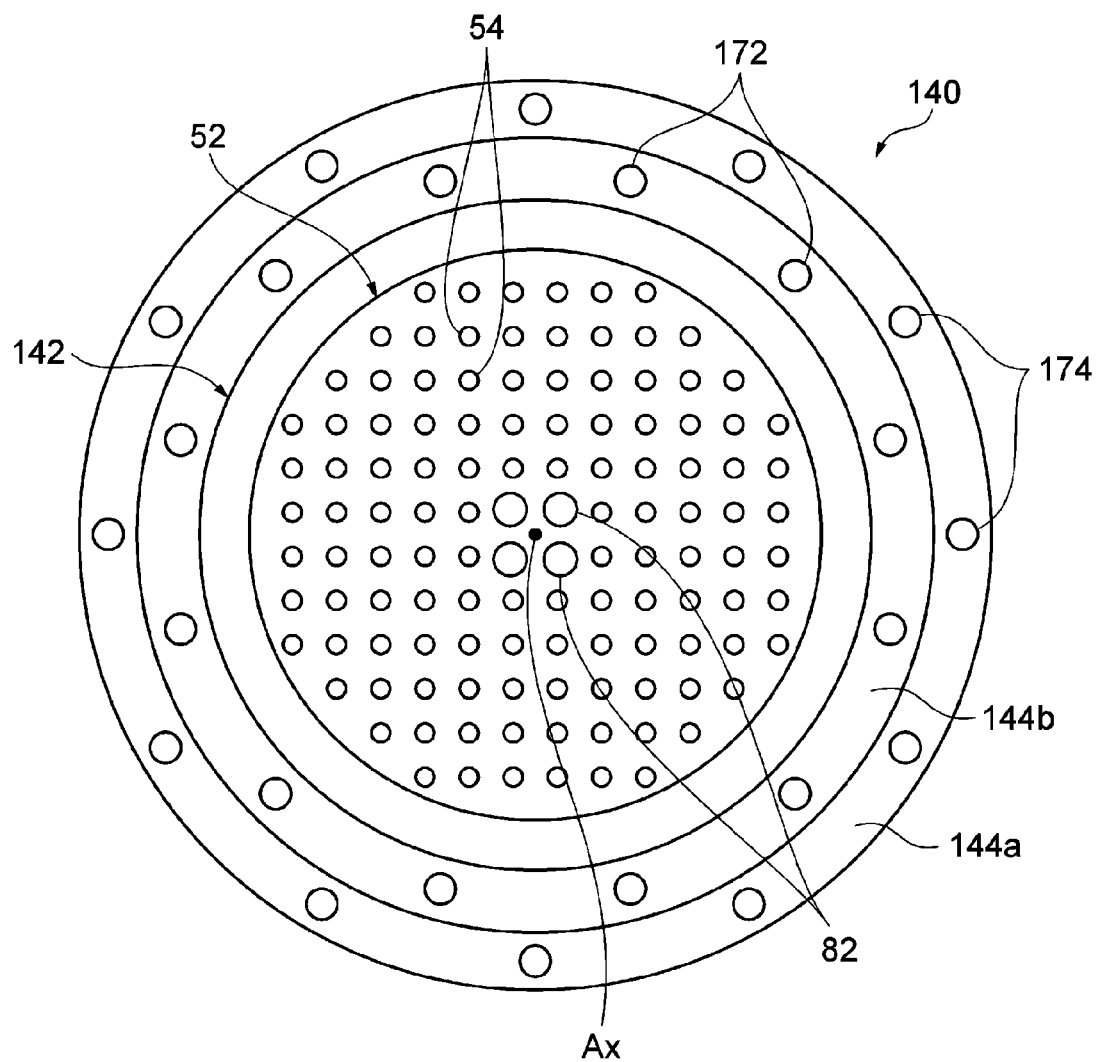
FIG. 14 is a schematic view illustrating an exemplary gas ejector and outer peripheral exhauster.

The plurality of first exhaust holes 172 is provided in the side wall 144 of the lid 140, and is open in the inclined inner peripheral surface 144b of the side wall 144. As illustrated in FIG. 14, the plurality of first exhaust holes 172 may be annularly arranged outward than the ceiling plate 142. Like the exhaust holes 72, the plurality of first exhaust holes 172 may be provided in the ceiling plate 142, and may be open in the outer peripheral portion of the bottom surface of the ceiling plate 142.

The plurality of second exhaust holes 174 (the plurality of outer peripheral exhaust holes) is provided in the side wall 144 of the lid 140, and is open in the lower end surface 144a of the side wall 144. The second exhaust holes 174 is open in the gap g between the lid 140 (the side wall 144) and the holder 130 (peripheral wall 134) when the chamber 40A is in the closed state. The plurality of second exhaust holes 174 may be annularly arranged outward than the plurality of first exhaust holes 172. The height position of the second exhaust holes 174 is lower than the height position of the first exhaust holes 172, and is lower than the height position of the exhaust holes 82 in the central exhauster 80.

The first exhaust holes 172 and the second exhaust holes 174 are connected to an exhaust pump via an exhaust duct 176. The exhaust duct 176 may be formed such that exhaust flow paths, which are connected to the plurality of first exhaust holes 172 and the plurality of second exhaust holes 174, respectively, are integrated into one flow path in the lid 140. The outer peripheral exhauster 70A having the above-described configuration exhausts the gas in the processing space S through the second exhaust holes 174, which are open in the gap g, and the gap g, and also exhausts the gas in the processing space S through the first exhaust holes 172. The outer peripheral exhauster 70A may not have the plurality of first exhaust holes 172, and may discharge the gas in the processing space S through the second exhaust holes 174 and the gap g.

Figure 15A:
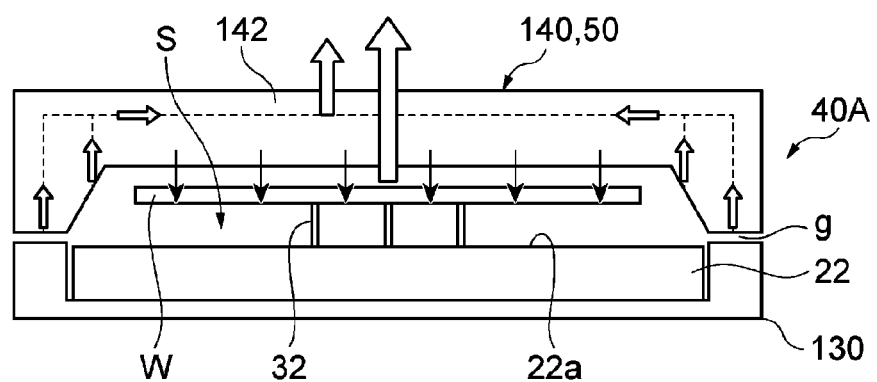
FIGS. 15A and 15B are views illustrating an exemplary operation of respective components in a heat processing procedure.
Figure 15B:
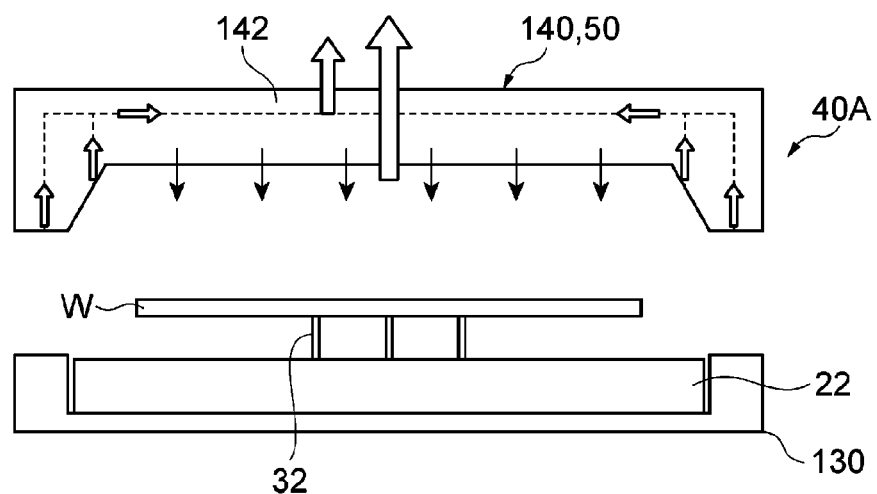

The controller 104 of the control device 100 may cause the heat processing unit U20 according to the second embodiment to execute the heat processing procedure illustrated in FIG. 7, like the heat processing procedure in the heat processing unit U2 according to the first embodiment. In this case, in step S21, as shown in FIG. 15A, the controller 104 causes the lifting driver 34 to move up the support pins 32 such that the wafer W is brought closer to the ceiling plate 142 after the heat process. In step S23 (after the elapse of the third predetermined time), as illustrated in FIG. 15B, the controller 104 controls the chamber driver 48 such that the chamber 40A switches from the closed state to the open state. For example, the controller 104 moves up the lid 140 by using the chamber driver 48 such that the lid 140 of the chamber 40A is separated from the holder 130. In the heat processing procedure according to the second embodiment, the up and down movement of the lid 140 corresponds to the up and down movement of the chamber 40 according to the first embodiment.

In the process of step S21, the controller 104 may control the lifting driver 34 to move up the wafer W to a position higher than the second exhaust holes 174. That is, the standby position between the processing position where the wafer W is heated and the delivery position where the wafer W is loaded into and unloaded from the chamber 40A may be higher than the second exhaust holes 174 when the chamber 40A is in the closed state. In this case, the height position of the rear surface of the wafer W, which is opposite to the surface of the wafer W on which a film is formed, arranged at the standby position may be higher than the opening edges of the second exhaust holes 174. The height position of the rear surface of the wafer W arranged at the standby position may be equal to or lower than the lowermost portion of the opening edges of the first exhaust holes 172, or may be higher than the lowermost portion of the opening edges of the first exhaust holes 172.

Here, details of an exemplary heater 20 will be described with reference to FIGS. 16 and 17. As illustrated in FIG. 16, the heater 20 may include the hot plate 22, a plurality of gap pins 182, and a suction hole 184. Since the hot plate heater 24 is incorporated in the hot plate 22 as described above, the hot plate 22 uses the hot plate heater 24 as a heat source to generate heat for heating the wafer W as a processing target. The mounting surface (main surface) 22a of the hot plate 22 faces the rear surface of the wafer W when the heater 20 supports the wafer W.

The plurality of gap pins 182 is provided on the mounting surface 22a of the hot plate 22. The gap pins 182 are protrusions that protrude upward from the mounting surface 22a. When the wafer W as a processing target is placed on the mounting surface 22a, the gap pins 182 support the wafer W to form a gap between the mounting surface 22a and the wafer W (the rear surface of the wafer W).

The suction hole 184 suctions the wafer W placed on the gap pins 182. The suction hole 184 is provided to penetrate the hot plate 22 in the thickness direction (the direction perpendicular to the mounting surface 22a), and is open to the mounting surface 22a. The suction hole 184 is open to the gap (space) between the rear surface of the wafer W and the mounting surface 22a in a state in which the gap pins 182 support the wafer W. The heater 20 may include a plurality of suction holes 184. A suction pump is connected to the suction holes 184 via a suction path 186. Due to the suction of the suction pump, in the gap between the rear surface of the wafer W and the mounting surface 22a, a suction force is applied to the rear surface of the wafer W in the direction approaching the mounting surface 22a. Since the rear surface of the wafer W on the plurality of gap pins 182 is suctioned through the plurality of suction holes 184, warpage generated in the wafer W is corrected (eliminated).

Figure 17:
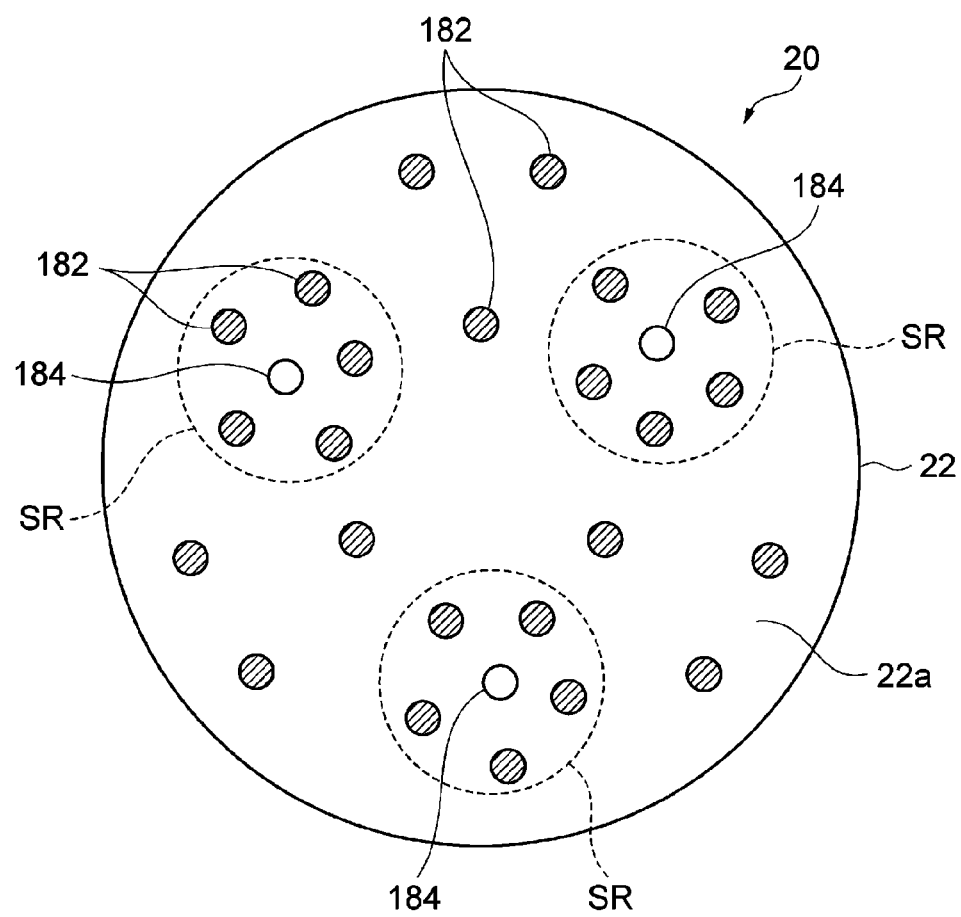
FIG. 17 is a plan view schematically illustrating details of an exemplary heater.

FIG. 17 schematically illustrates an exemplary arrangement of the gap pins 182 and the suction holes 184 when the mounting surface 22a of the hot plate 22 is viewed from above. The gap pins 182 include a first group of gap pins 182 arranged in regions (hereinafter, referred to as "suction regions SR") in the vicinity of the respective suction holes 184, and a second group of gap pins 182 arranged in a region (a non-suction region) other than the suction regions SR. Each suction region SR is a region facing a portion of the rear surface of the wafer W affected by the suction force from the suction holes 184, and may be set to be within a range having a radius of, for example, about 3 to 20 times the radius of the suction holes 184. Each suction regions SR may be set to be within a range having a radius of about 1/10 times to 1/3 times the radius of the wafer W.

The number of gap pins 182 of the first group per unit area of the suction regions SR is greater than the number of gap pins 182 of the second group per unit area of the non-suction region, which is other than the suction regions SR. The sizes of the plurality of gap pins 182 (areas of regions surrounded by the outer edges of the respective gap pins 182 when the mounting surface 22a is viewed from above) may be substantially the same with one another. In this case, when the mounting surface 22a is viewed from above, a ratio occupied by the gap pins 182 of the first group in the suction regions SR (a ratio occupied by the areas of the gap pins 182 of the first group to the total area of the suction regions SR) is larger than a ratio occupied by (areas of) the gap pins 182 of the second group in the non-suction region. In the arrangement described above, a distance between adjacent gap pins 182 in the suction regions SR is smaller than a distance between adjacent gap pins 182 in the non-suction region.

The processing module 11 may have two heat processing units configured to perform heat processes under different heat processing conditions. The processing module 11 may include, for example, heat processing units U21 and U22 configured to perform heat processes under mutually different heat processing conditions. Each of the heat processing units U21 and U22 has a configured similar to that of the heat processing unit U20, except for a part of the configuration thereof. A heating temperature of the wafer W in the heat process performed by the heat processing unit U21 (a first heat processing unit) may be higher than a heating temperature of the wafer W in the heat process performed by the heat processing unit U22 (a second heat processing unit). When a heating temperature is high in a heat process, a stress generated inside the wafer W due to thermal expansion of the wafer W caused by the heating (more specifically, a stress having components in directions along the surface of the wafer W) tends to increase. Therefore, in each of the heat processing units U21 and U22, the number of gap pins 182 is adjusted depending on the heating temperature of the heat process.

Figure 18A:
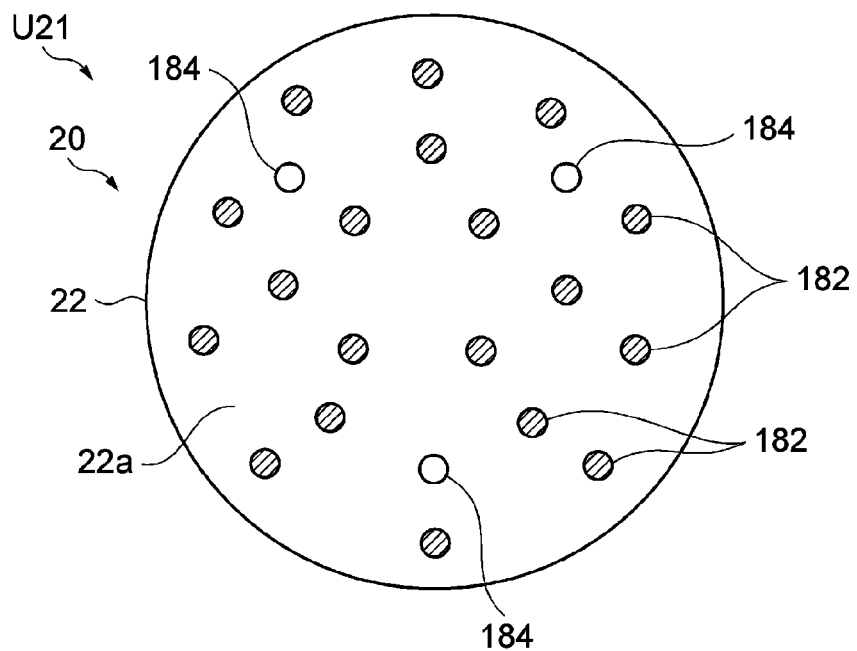
FIGS. 18A and 18B are schematic views illustrating exemplary heaters of a heat processing unit according to a modification.
Figure 18B:
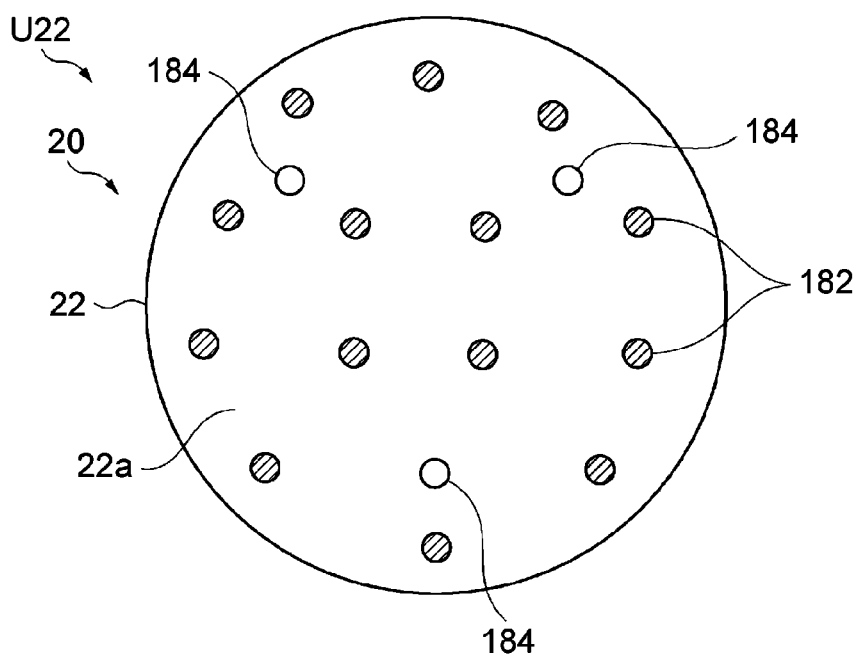

Specifically, as illustrated in FIGS. 18A and 18B, the heater 20 of the heat processing unit U21 and the heater 20 of the heat processing unit U22 have configurations different from each other in terms of the number (total number) of gap pins 182. The number (total number) of gap pins 182 included in the heater 20 of the heat processing unit U21, which performs the heat process at a high heating temperature, is greater than the number (total number) of gap pins 182 included in the heater 20 of the heat processing unit U22, which performs the heat process at a low heating temperature. As a result, between the heat processing unit U21 and the heat processing unit U22, a difference in load received by each gap pin 182 (load received by one gap pin 182) from the stress inside the wafer W generated by thermal expansion thereof becomes small.

Instead of, or in addition to, the heating temperature during the heat processing time, gas suction forces (a gas suction amount per unit time) from the suction holes 184 may be different from each other between the heat process in the heat processing unit U21 and the heat process in the heat processing unit U22. More specifically, the suction force applied to the wafer W from the suction holes 184 in the heater 20 of the heat processing unit U21 may be larger than the suction force applied to the wafer W from the suction holes 184 in the heater 20 of the heat processing unit U22. When the suction force applied from the suction holes 184 is large, the stress generated inside the wafer W with elimination of the warpage due to the suction of the wafer W (the stress having components in directions along the surface of the wafer W) tends to increase. Therefore, in the heat processing units U21 and U22, the number of gap pins 182 is adjusted depending on the suction force from the suction holes 184.

The number of gap pins 182 included in the heater 20 of the heat processing unit U21, which performs the heat treatment in a state in which the suction force applied to the wafer W is large, is greater than the number of gap pins 182 included in the heater 20 of the heat processing unit U22, which performs the heat treatment in a state in which the suction force applied to the wafer W is small. Therefore, between the heat processing unit U21 and the heat processing unit U22, the difference in the load applied to each gap pin 182 due to the stress generated inside the wafer W with the elimination of the warpage by the suction is reduced. In addition, in each of the heater 20 of the heat processing units U21 and U22, as in the arrangement illustrated in FIG. 17, the number of gap pins 182 per unit area in a region in the vicinity of each suction hole 184 may be greater than the number of gap pins 182 per unit area in a region other than the region in the vicinity of each suction hole 184.

Effect of Second Embodiment

In the coating and development apparatus 2 including the heat processing units U20, U21, and U22 according to the second embodiment, it is possible to improve the uniformity in thickness of the film as a processing target while efficiently recovering the sublimate, as in the coating and development apparatus 2 according to the first embodiment.

In the second embodiment described above, the outer peripheral exhauster 70A includes outer peripheral exhaust holes (second exhaust holes 174) configured to evacuate the processing space S. The control device 100 controls the substrate lifter 30 to move up the wafer W to a position higher than the outer peripheral exhaust hole when the wafer W is brought closer to the ceiling plate 142. In this case, when the wafer W is brought closer to the ceiling plate 142, the outward gas flow on the surface of the wafer W due to the gas exhaustion through the outer peripheral exhaust holes is weakened. Therefore, the possibility that the sublimate flows out of the wafer W is reduced, and thus it is possible to more efficiently recover the sublimate.

In the second embodiment described above, the chamber 40A covers the wafer W on the heater 20 in the state in which the communication portion (gap g) connecting the processing space S and the external space of the chamber 40A is formed in the outer peripheral region. The outer peripheral exhauster 70A includes the outer peripheral exhaust holes (second exhaust holes 174) which are open to the communication portion, and evacuates the processing space S through the outer peripheral exhaust holes and the communication portion. In this case, it is possible to prevent the sublimate from leaking to the external space of the chamber through the communication portion. Specifically, since the sublimate flowing from the processing space S to the external space of the chamber passes through the communication portion, it is possible to reduce the possibility of leakage of the sublimate by exhausting the sublimate through the communication portion.

In the second embodiment described above, the chamber 40A includes the holder 130 configured to hold the heater 20, and the lid 140 arranged in the state in which the gap g is provided between the holder 130 and the lid 140 so as to cover the wafer W on the heater 20 from above. The gap g between the holder 130 and the lid 140 functions as the communication portion. In this case, since the holder and the lid do not come into contact with each other when the chamber 40A is opened and closed, it is possible to suppress generation of particles when the chamber 40A is opened and closed.

In the second embodiment described above, the heater 20 includes the hot plate 22 configured to generate heat for heating the wafer W, the plurality of gap pins 182 provided on the main surface (the mounting surface 22a) of the hot plate 22 and configured to support the wafer W such that a gap is formed between the main surface and the wafer W, and suction holes 184 configured to suction the wafer W arranged on the plurality of gap pins 182. The plurality of gap pins 182 includes the first group of gap pins 182 arranged in the suction regions SR located in the vicinity of the suction holes 184 in the main surface, and the second group of gap pins 182 arranged in the non-suction region other than the suction regions SR of the main surface. The number of gap pins 182 in the first group per unit area of the suction regions SR is greater than the number of gap pins 182 in the second group per unit area of the non-suction region other than the suction regions SR. Since the suction force from the suction holes 184 is large in the suction regions SR, the load applied to one gap pin 182 tends to increase due to the stress generated inside the wafer W. In the configuration described above, by setting the number of gap pins 182 in the first group per unit area in the suction regions SR to be large, an increase in the load applied to one gap pin 182 is suppressed. The load applied to one gap pin 182 causes friction at the contact portion between the wafer W and the gap pin 182. Therefore, by suppressing the increase in the load, generation of particles from the wafer W and the gap pins 182 due to the friction is suppressed.

In the second embodiment described above, the coating and development apparatus 2 includes a plurality of heat processing units. The heater 20 includes the hot plate 22 configured to generate heat for heating the wafer W, the plurality of gap pins 182 provided on the main surface (the mounting surface 22a) of the hot plate 22 and configured to support the wafer W such that a gap is formed between the main surface and the wafer W, and the suction holes 184 configured to suction the wafer W arranged on the plurality of gap pins 182. The plurality of heat processing units includes a first heat processing unit (the heat processing unit U21) and a second heat processing unit (the heat treatment unit U22). The heating temperature of the wafer W in the heat process performed by the first heat processing unit is higher than the heating temperature of the wafer W in the heat process performed by the second heat processing unit. The number of gap pins 182 included in the heater 20 of the first heat processing unit is greater than the number of gap pins 182 included in the heater 20 of the second heat processing unit. When the heating temperature of the wafer W in the heat process is high, the load applied to one gap pin 182 tends to increase due to the stress generated inside the wafer W by the thermal expansion of the wafer W. In the configuration described above, by setting the number of gap pins 182 included in the heater 20 of the first heat processing unit to be large, which performs the heat process at a high heating temperature, the increase in the load applied to one gap pin 182 is suppressed.

In the second embodiment described above, the coating and development apparatus 2 may include a plurality of heat processing units. The heater 20 includes the hot plate 22 configured to generate heat for heating the wafer W, the plurality of gap pins 182 provided on the main surface (the mounting surface 22a) of the hot plate 22 and configured to support the wafer W such that a gap is formed between the main surface and the wafer W, and the suction holes 184 configured to suction the wafer W arranged on the plurality of gap pins 182. The plurality of heat processing units includes the first heat processing unit (the heat processing unit U21) and the second heat processing unit (the heat processing unit U22). The suction force applied to the wafer W from the suction holes 184 in the first heat processing unit is larger than the suction force applied to the wafer W from the suction holes 184 in the second heat processing unit. The number of gap pins 182 included in the heater 20 of the first heat processing unit is greater than the number of gap pins 182 included in the heater 20 of the second heat processing unit. When the suction force from the suction holes 184 is large, the load applied to one gap pin 182 tends to increase due to the stress generated inside the wafer W. In the configuration described above, by setting the number of gap pins 182 included in the heater 20 of the first heat processing unit, which performs the heat process in the state in which the suction force is large, to be large, the increase in the load applied to one gap pin 182 is suppressed.

Third Embodiment

Figure 20:
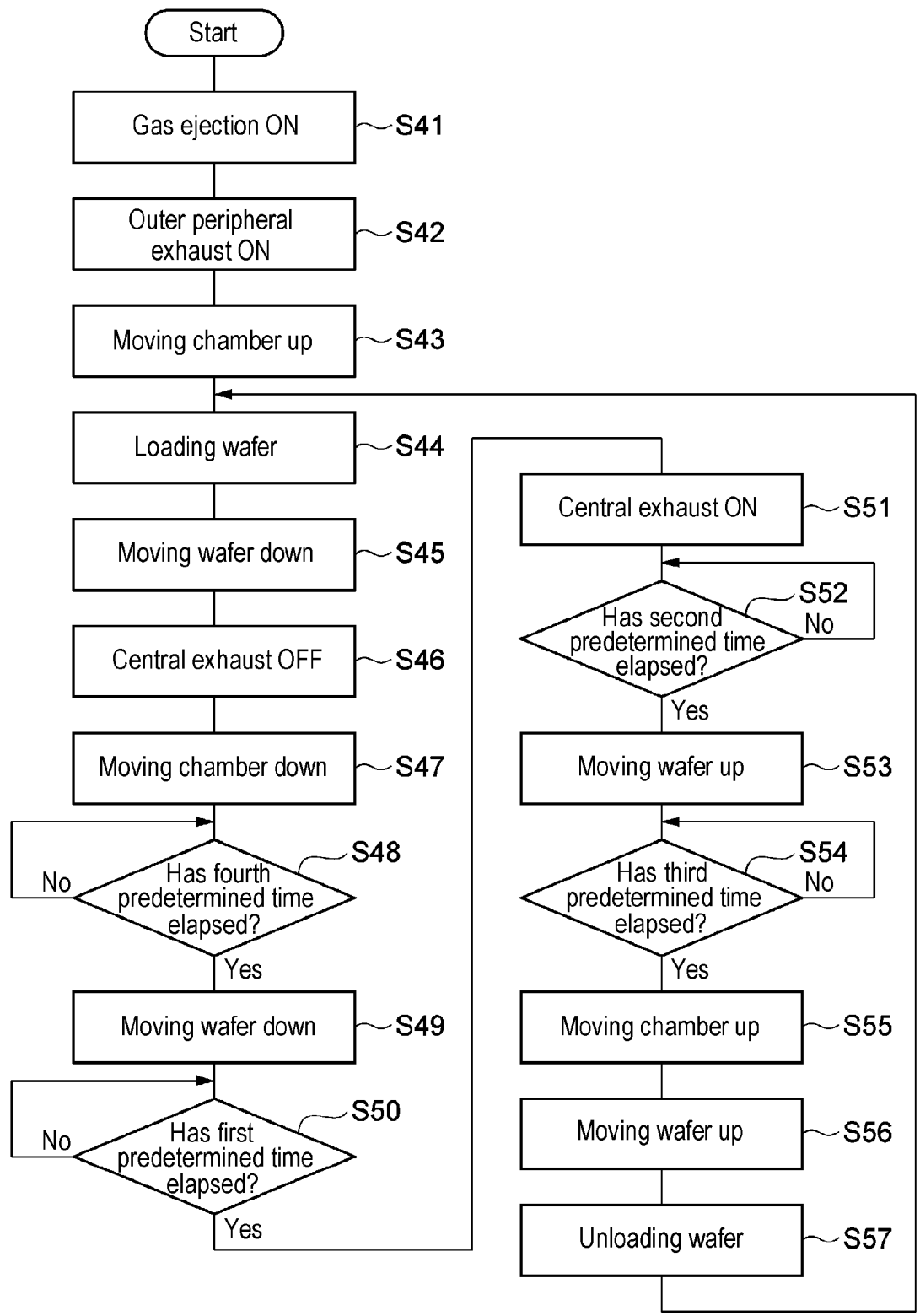
FIG. 20 is a flowchart illustrating an exemplary heat processing procedure.

Next, a substrate processing system according to a third embodiment will be described with reference to FIGS. 19 to 21. The substrate processing system according to the third embodiment differs from the substrate processing system 1 according to the first embodiment in that the former includes a coating and development apparatus 2B instead of the coating and development apparatus 2. As illustrated in FIG. 19, the processing block 5 of the coating and development apparatus 2B includes, instead of the processing modules 11, 12, 13, and 14, two processing modules 11, two processing modules 12, and two accommodators 16. Each accommodator 16 accommodates, for example, auxiliary devices (units) necessary for processing a wafer W in the processing modules 11 and the processing modules 12. Examples of the auxiliary devices include a unit configured to supply a processing liquid to each coating unit U1 or U3 and a unit configured to supply a gas to each heat processing unit U2.

The coating and development apparatus 2B includes a gas supply unit 200 accommodated in the accommodator 16 and configured to supply a gas to each heat processing unit U2 of the processing modules 11. As illustrated in FIG. 19, the gas supply unit 200 may be arranged in the lower accommodator 16. Since the gas supply unit 200 is provided in the accommodator 16, the gas supply unit 200 is arranged in a separate space partitioned from a space in which each heat processing unit U2 is accommodated in the processing modules 11. For example, the space in which the heat processing unit U2 is arranged and the space in which the gas supply unit 200 is arranged are partitioned from each other by a floor supporting each unit of the processing modules 11.

The gas supply unit 200 supplies a gas adjusted such that a concentration of one component thereof becomes a predetermined value (hereinafter, referred to as an "adjusted gas") to the gas ejector 50 of each heat processing unit U2. In this case, the gas ejector 50 ejects the adjusted gas toward the surface of the wafer W from the plurality of ejection holes 54. The adjusted gas may be, for example, a gas in which an oxygen concentration is adjusted. In addition, a gas in which a concentration of a component such as nitrogen, ammonia, or argon is adjusted may be used as the adjusted gas. The predetermined value for the concentration of one component is determined in advance depending on, for example, a target value of the concentration of the component in the processing space S during the heat process.

The gas supply unit 200 may generate the adjusted gas by mixing a gas (first gas) containing a component the concentration of which is to be adjusted (hereinafter referred to as an "adjusted component") and a gas (second gas) containing another component different from the adjusted component. For example, the gas supply unit 200 generates an adjusted gas in which the concentration of oxygen is adjusted to a predetermined value by mixing an oxygen gas containing oxygen as a main component (high-concentration oxygen gas) and a nitrogen gas containing nitrogen as a main component (high-concentration nitrogen gas).

In an example, as illustrated in FIG. 19, the gas supply unit 200 is supplied with an oxygen gas from a gas source 202 of the oxygen gas through a gas supply path 204, and is supplied with a nitrogen gas from a gas source 206 of the nitrogen gas through a gas supply path 208. The gas supply unit 200 generates an adjusted gas by mixing the oxygen gas from the gas source 202 and the nitrogen gas from the gas source 206 in the accommodator 16 such that the concentration of oxygen becomes a predetermined value. Then, the gas supply unit 200 supplies the adjusted gas to the head 52 through a gas supply path 210 and the supply path 56 branched from the gas supply path 210. Since the adjusted gas is a mixture of multiple kinds of gases, the concentration of the adjusted component (e.g., the concentration of oxygen) in the adjusted gas flowing through the gas supply path 210 becomes lower than the concentration of the adjusted component (e.g., the concentration of oxygen) in the oxygen gas flowing through the gas supply path 204.

The controller 104 of the control device 100 may cause the heat processing unit U2 according to the third embodiment to perform heat processes according to the same procedure as the heat processing procedure illustrated in FIG. 7. FIG. 20 is a flowchart illustrating an exemplary heat processing procedure performed in the heat processing unit U2 according to the third embodiment. First, the controller 104 executes steps S41 to S44 in the same manner as steps S11 to S14 in a state in which the hot plate 22 is maintained at a predetermined temperature and the gas exhaustion is performed by the central exhauster 80. By executing step S41, the adjusted gas in which the concentration of the adjusted component is adjusted starts to be ejected from the gas ejector 50. In the following, a case where an adjusted gas, the concentration of oxygen of which is adjusted, is used will be illustrated as an example.

Next, the controller 104 controls the lifting driver 34 to move the wafer W down (step S45). Unlike the process in step S15 described above, the controller 104 controls the lifting driver 34 to move down the wafer W to a position (e.g., the standby position described above) set between the processing position where the wafer W is heated and the delivery position where the wafer W is loaded and unloaded. Since the processing space S is not formed at this time point, the concentration of oxygen in the space above the hot plate 22 is substantially the same as the concentration of oxygen in the accommodation space V in the housing 198 (e.g., the concentration of oxygen in atmosphere).

Next, the controller 104 executes steps S46 and S47 like steps S16 and S17. Then, the controller 104 waits until a fourth predetermined time elapses after moving down the chamber 40 is completed (after the processing space S is formed). The fourth predetermined time is stored in the storage 102. The fourth predetermined time is set to such an extent that the concentration of oxygen in the processing space S approaches a target concentration Tc.

Figure 21:
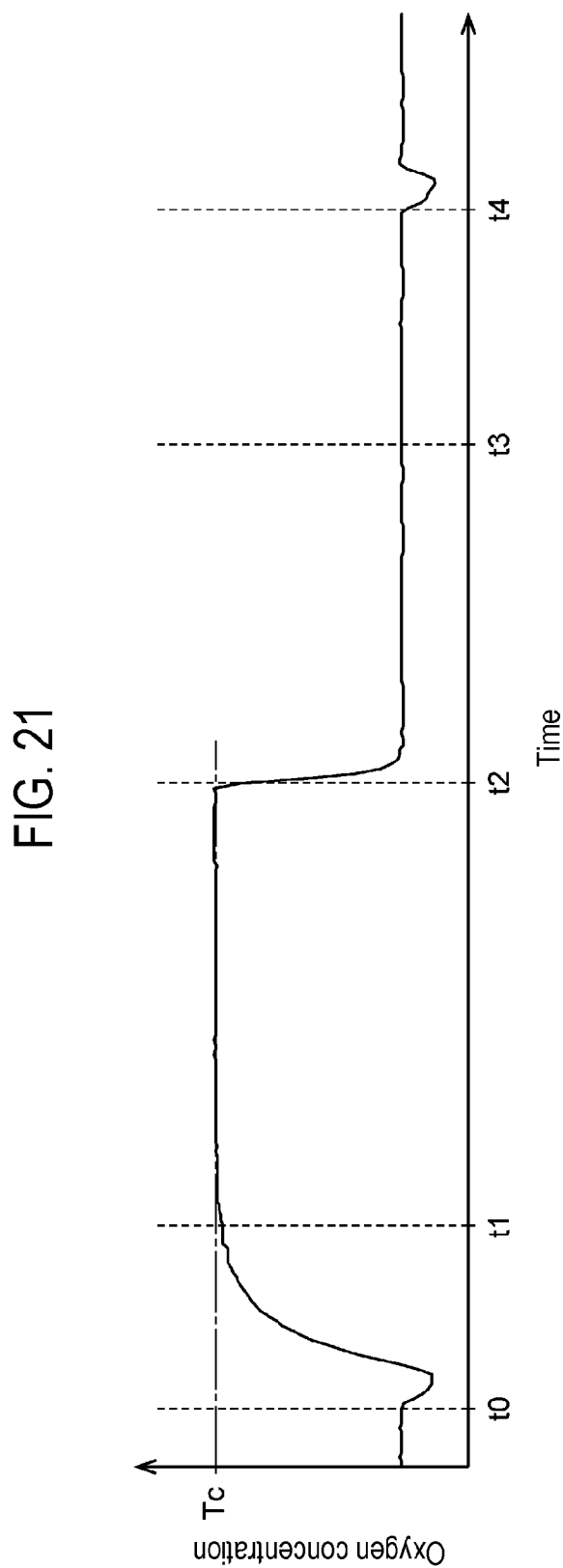
FIG. 21 is a graph illustrating an exemplary temporal change in an oxygen concentration in a processing space.

FIG. 21 illustrates an exemplary temporal change in concentration of oxygen in the processing space S (the space above the hot plate 22). In the graph illustrated in FIG. 21, step S47 is executed (the processing space S is formed) at time t0. The period from time t0 to time t1 corresponds to the fourth predetermined time, and the concentration of oxygen in the processing space S becomes substantially equal to the target concentration Tc at time t1.

Next (after the elapse of the fourth predetermined time), the controller 104 controls the lifting driver 34 to further move the wafer W (down step S49). Specifically, the controller 104 moves down the support pins 32 supporting the wafer W by the lifting driver 34 such that the wafer W is placed on the mounting surface 22a on the hot plate 22. As a result, heating of the wafer W as a processing target is started.

Next, as in step S18, the controller 104 waits until the first predetermined time elapses after heating the wafer W is started (step S50). While the controller 104 waits until the first predetermined time elapses, the first state in which the processing space S is evacuated from the outer peripheral exhauster 70 continues. During the first predetermined time, the gas in which the content of oxygen is adjusted is ejected from the plurality of ejection holes 54 toward the surface of the wafer W on the hot plate 22 by the gas ejector 50, while the gas is not exhausted from the central region and is exhaust from the outer peripheral region.

In the graph of FIG. 21, the period from time t1 to time t2 corresponds to the first predetermined time, and the concentration of oxygen in the processing space S is maintained substantially constant during the period from time t1 to time t2. That is, the concentration of the adjusted gas supplied from the gas supply unit 200 described above is set such that the concentration of oxygen in the processing space S is maintained at the target concentration Tc in the first state in which the gas is exhausted from the outer peripheral region.

Next, as in step S19, the controller 104 switches the gas exhaustion by the central exhauster 80 from the stopped state to the exhaust state (step S51). As a result, the exhaust state in the chamber 40 is switched from the first state to the second state in which the gas is exhausted from the outer peripheral region and the central region. Since the exhaust amount from the exhauster 60 increases with the switching to the second state, the concentration of oxygen in the processing space S is affected by the concentration of oxygen of the gas outside the processing space S. For example, as illustrated in FIG. 21, after time t2, the concentration of oxygen of the gas in the processing space S changes (decreases) to the extent that it substantially matches the concentration of oxygen of the gas outside the chamber 40.

Next, the controller 104 executes steps S52 to S57 like steps S20 to S25. In the graph of FIG. 21, step S53 is executed at time t3, and thus heating the wafer W is completed, and step S55 is executed at time t4, and thus the chamber 40 is switched to the open state. After time t2, the concentration of oxygen in the processing space S (the space above the hot plate 22) is maintained substantially constant, at the same level as the concentration of oxygen in the external space of the chamber 40.

After the completion of step S57, the controller 104 repeats the series of processes of steps S44 to S57. As a result, heat processes are sequentially performed on a plurality of wafers W. In the example described above, the controller 104 causes the gas ejector 50 to eject the adjusted gas during the entire period of the heat processes for one wafer W. Alternatively, the controller 104 may cause the gas ejector 50 to eject the adjusted gas during the entire heating period or the first half of the heating period for the wafer W as a processing target, and may not cause the gas ejector 50 to eject the adjusted gas during a period other than these periods. The first half period of the heating period for the wafer W may correspond to the period in which the first state, in which the outer peripheral exhaust is performed without performing the central exhaust, continues.

Effect of Third Embodiment

In the coating and development apparatus 2 according to the third embodiment as well, it is possible to improve the uniformity in thickness of the film as a heat processing target while efficiently recovering the sublimate, as in the coating and development apparatus 2 according to the first embodiment.

In the third embodiment described above, the coating and development apparatus 2B further includes the gas supply unit 200 configured to mix the first gas containing one component and the second gas containing another component so as to generate an adjusted gas in which a concentration of the one component is adjusted, and configured to supply the adjusted gas to the gas ejector 50. The gas ejector 50 ejects the adjustment gas toward the surface of the wafer W. The gas supply unit 200 is arranged in a separate space partitioned from the space in which the heat processing unit U2 is arranged. In this case, it is possible to maintain the concentration of the one component contained in the gas around the wafer W substantially constant while the wafer W is being heated. Thus, it is possible to adjust quality of the film after heat processes. In addition, it is possible to reduce influence of the heat generated during the heat processes on the members for generating the adjusted gas (e.g., the pipes for the first gas and the second gas).

In the third embodiment described above, the control device 100 causes the gas ejector 50 to eject the adjusted gas from the plurality of ejection holes 54 at least in the first half of the period in which the heater 20 heats the wafer W. Since film formation proceeds during the first half of the period in which the wafer W is heated, it is possible to more reliably adjust the quality of the film by using the adjusted gas.

According to the present disclosure, there are provided a substrate processing apparatus, a substrate processing method, and a storage medium capable of improving uniformity in thickness of a film as a heat processing target.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a heat processing unit configured to perform a heat process on a substrate having a film formed on the substrate; and
a control unit configured to control the heat processing unit,
wherein the heat processing unit comprises:
a heater configured to support and heat the substrate;
a chamber configured to cover the substrate supported on the heater;
a gas ejector having a head in which a plurality of ejection holes scattered along a surface facing the substrate supported on the heater is formed, and configured to eject a gas from the plurality of ejection holes toward a surface of the substrate;
an outer peripheral exhauster configured to evacuate a processing space inside the chamber from an outer peripheral region located further outward than a peripheral edge of the substrate supported on the heater; and
a central exhauster configured to evacuate the processing space from a central region located further inward than the peripheral edge of the substrate supported on the heater,
wherein the chamber covers the substrate on the heater in a state in which a communication portion connecting the processing space and an external space of the chamber is formed in the outer peripheral region, wherein the outer peripheral exhauster comprises an outer peripheral exhaust hole that is open to the communication portion, and evacuates the processing space through the outer peripheral exhaust hole and the communication portion, wherein the chamber further comprises a holder configured to hold the heater, and a lid arranged in a state in which a gap is provided between the holder and the lid so as to cover the substrate on the heater from above, and wherein the gap between the holder and the lid functions as the communication portion.

2. The substrate processing apparatus of claim 1, wherein the heat processing unit further comprises:
a substrate lifter configured to move the substrate up and down; and
an opening and closing switcher configured to switch between a closed state in which the processing space is formed by the chamber, and an open state in which the chamber is separated from the heater compared to the closed state,
wherein the chamber comprises a ceiling plate provided with the head, and
wherein the control unit is further configured to: control the substrate lifter to move up the substrate from the heater and bring the substrate close to the ceiling plate; and control the opening and closing switcher to switch from the closed state to the open state after bringing the substrate closer to the ceiling plate.

3. The substrate processing apparatus of claim 2, wherein the outer peripheral exhauster has an outer peripheral exhaust hole through which the processing space is evacuated, and
wherein the control unit is further configured to control the substrate lifter to move up the substrate to a position higher than the outer peripheral exhaust hole when the substrate is brought closer to the ceiling plate.

4. The substrate processing apparatus of claim 1, wherein the heat processing unit sequentially performs the heat process on a plurality of substrates including the substrate, and
wherein the control unit is further configured to cause the gas to be continuously ejected from the plurality of ejection holes during a period in which a substrate as a processing target is replaced.

5. The substrate processing apparatus of claim 1, wherein the central exhauster comprises a central exhaust hole provided in the head so as to be open to the processing space, and
wherein the gas ejector further comprises a nozzle configured to eject the gas downward from the central exhaust hole.

6. The substrate processing apparatus of claim 1, further comprising:
a gas supply unit configured to mix a first gas containing one component and a second gas containing another component to generate an adjusted gas that is adjusted such that a concentration of the one component becomes a predetermined value, and configured to supply the adjusted gas to the gas ejector,
wherein the gas ejector ejects, as the gas ejected from the plurality of ejection holes, the adjusted gas toward the surface of the substrate, and wherein the gas supply unit is arranged in a separate space partitioned from a space in which the heat processing unit is arranged.

7. The substrate processing apparatus of claim 6, wherein the control unit is further configured to cause the gas ejector to eject the adjusted gas at least in a first half of a period during which the heater heats the substrate.

8. The substrate processing apparatus of claim 1, wherein the heater comprises:
a hot plate configured to generate heat for heating the substrate;
a plurality of gap pins provided on a main surface of the hot plate to support the substrate such that a gap is formed between the main surface and the substrate; and
a suction hole formed in the main surface, and configured to suction the substrate placed on the plurality of gap pins,
wherein the plurality of gap pins includes a first group of gap pins arranged in a suction region of the main surface in the vicinity of the suction hole, and a second group of gap pins arranged in a non-suction region of the main surface other than the suction region, and
wherein the number of gap pins of the first group per unit area in the suction region is greater than the number of gap pins of the second group per unit area in the non-suction region.

9. The substrate processing apparatus of claim 1, wherein the substrate processing apparatus comprises a plurality of heat processing units including the heat processing unit, and
wherein the heater comprises:
a hot plate configured to generate heat for heating the substrate;
a plurality of gap pins provided on a main surface of the hot plate to support the substrate such that a gap is formed between the main surface and the substrate; and
a suction hole formed in the main surface to suction the substrate placed on the plurality of gap pins,
wherein the plurality of heat processing units comprises a first heat processing unit and a second heat processing unit,
wherein a heating temperature of the substrate in a heat process performed by the first heat processing unit is higher than a heating temperature of the substrate in a heat treatment performed by the second heat processing unit, and
wherein the number of the plurality of gap pins included in the heater of the first heat processing unit is greater than the number of the plurality of gap pins included in the heater of the second heat processing unit.

10. The substrate processing apparatus of claim 1, wherein the substrate processing apparatus comprises a plurality of heat processing units including the heat processing unit, and
wherein the heater comprises:
a hot plate configured to generate heat for heating the substrate;
a plurality of gap pins provided on a main surface of the hot plate to support the substrate such that a gap is formed between the main surface and the substrate; and
a suction hole formed in the main surface to suction the substrate placed on the plurality of gap pins,
wherein the plurality of heat processing units comprises a first heat processing unit and a second heat processing unit,
wherein a suction force applied to the substrate from the suction hole in the first heat processing unit is larger than a suction force applied to the substrate from the suction hole in the second heat processing unit, and wherein the number of the plurality of gap pins included in the heater of the first heat processing unit is greater than the number of the plurality of gap pins included in the heater of the second heat processing unit.

11. The substrate processing apparatus of claim 1, wherein the heat processing unit further comprises:

an exhaust switcher configured to switch an exhaust state between a first state in which the processing space is evacuated from the outer peripheral exhauster and a second state in which the processing space is evacuated at least from the central exhauster, and wherein the control unit is configured to control the exhaust switcher to switch from the first state to the second state while ejecting the gas from the plurality of ejection holes by the gas ejector.

12. A substrate processing method comprising:

performing a heat process on a substrate having a film formed on the substrate, wherein the performing the heat process on the substrate comprises:

causing the substrate to be supported on and heated by a heater in a state in which the substrate is covered by a chamber;

evacuating a processing space inside the chamber from an outer peripheral region located further outward than a peripheral edge of the substrate supported on the heater;

evacuating the processing space from a central region located further inward than the peripheral edge of the substrate supported on the heater;

ejecting a gas toward a surface of the substrate from a plurality of ejection holes scattered along a surface facing the substrate supported on the heater; and sequentially performing the heat process on a plurality of substrates including the substrate, wherein the sequentially performing the heat process on the plurality of substrates comprises continuously ejecting the gas from the plurality of ejection holes during a period in which a substrate as a processing target is replaced.

13. The substrate processing method of claim 12, wherein the performing the heat process on the substrate further comprises:

bringing the substrate closer to a ceiling plate of the chamber by moving up the substrate from the heater; and switching from a closed state in which the processing space is formed by the chamber, to an open state in which the chamber is separated from the heater compared to the closed state, after bringing the substrate closer to the ceiling plate.

14. The substrate processing method of claim 13, wherein the evacuating the processing space from the outer peripheral region comprises evacuating the processing space through an outer peripheral exhaust hole, and wherein the bringing the substrate close to the ceiling plate comprises moving up the substrate to a position higher than the outer peripheral exhaust hole.

15. The substrate processing method of claim 12, wherein the evacuating the processing space from the central region comprises:

discharging the gas the in the processing space through a central exhaust hole provided in a head having the plurality of ejection holes formed in the head; and ejecting the gas from a nozzle toward a lower side of the central exhaust hole.

16. A non-transitory computer-readable storage medium storing a program that causes an apparatus to execute the substrate processing method of claim 14.

17. The substrate processing method of claim 12, wherein the performing the heat process on the substrate further comprises:

switching from a first state in which the processing space is evacuated from the outer peripheral region, to a second state in which the processing space is evacuated at least from the central region, while ejecting the gas from the plurality of ejection holes toward the surface of the substrate.

\* \* \* \* \*